(12) United States Patent
Tilton et al.

(10) Patent No.: US 8,174,828 B2
(45) Date of Patent: May 8, 2012

(54) NARROW GAP SPRAY COOLING IN A GLOBALLY COOLED ENCLOSURE

(75) Inventors: Charles L Tilton, Colton, WA (US); Donald E. Tilton, Colton, WA (US); Randall T. Palmer, Liberty Lake, WA (US); William J. Beasley, Athol, ID (US); Douglas W. Miller, Rathdrum, ID (US); Norman O. Alder, Liberty Lake, WA (US)

(73) Assignee: Parker-Hannifin Corporation, Cleveland, OH (US)

( * ) Notice: Subject to any disclaimer, the term of this patent is extended or adjusted under 35 U.S.C. 154(b) by 250 days.

(21) Appl. No.: 12/541,315

(22) Filed: Aug. 14, 2009

(65) Prior Publication Data

US 2010/0039773 A1 Feb. 18, 2010

Related U.S. Application Data

(63) Continuation-in-part of application No. 11/347,898, filed on Feb. 6, 2006, now Pat. No. 7,602,608.

(51) Int. Cl.
*H05K 7/20* (2006.01)

(52) U.S. Cl. ............... 361/689; 361/699; 165/104.33; 62/259.2; 174/15.1

(58) Field of Classification Search ............. 361/679.47, 361/679.53, 688, 689, 690, 691, 692, 697, 361/699, 700, 702
See application file for complete search history.

(56) References Cited

U.S. PATENT DOCUMENTS

| | | | | |
|---|---|---|---|---|
| 5,220,804 | A * | 6/1993 | Tilton et al. | 62/64 |
| 5,777,384 | A | 7/1998 | Root et al. | |
| 5,880,931 | A * | 3/1999 | Tilton et al. | 361/690 |
| 5,901,037 | A | 5/1999 | Hamilton et al. | |
| 5,907,473 | A | 5/1999 | Przilas et al. | |
| 5,943,211 | A * | 8/1999 | Havey et al. | 361/699 |
| 5,959,351 | A | 9/1999 | Sasaki et al. | |
| 6,018,192 | A | 1/2000 | Root et al. | |
| 6,064,572 | A | 5/2000 | Remsburg | |
| 6,108,201 | A * | 8/2000 | Tilton et al. | 361/689 |
| 6,205,799 | B1 * | 3/2001 | Patel et al. | 62/132 |
| 6,477,052 | B1 | 11/2002 | Barcley | |
| 6,550,263 | B2 | 4/2003 | Patel et al. | |
| 6,612,120 | B2 | 9/2003 | Patel et al. | |
| 6,678,168 | B2 | 1/2004 | Kenny, Jr. et al. | |
| 6,817,196 | B2 | 11/2004 | Malone et al. | |
| 6,952,346 | B2 | 10/2005 | Tilton et al. | |
| 6,955,062 | B2 * | 10/2005 | Tilton et al. | 62/259.2 |
| 7,104,078 | B2 | 9/2006 | Tilton | |
| 7,277,283 | B2 | 10/2007 | Campbell et al. | |
| 7,299,647 | B2 | 11/2007 | Tilton et al. | |

(Continued)

*Primary Examiner* — Courtney Smith
(74) *Attorney, Agent, or Firm* — Lee & Hayes, PLLC

(57) ABSTRACT

Electronic circuit boards are arranged as respective parallel pairs defining a narrow gap there between. One or more such pairs of boards are supported within a hermitically sealable housing and cooled by way of spraying an atomized liquid coolant from a plurality of nozzles into each narrow gap. Transfer of heat from the circuit boards results in vaporization of at least some of the atomized liquid within the narrow gap. The housing further serves to guide a circulation of vapors out of each narrow gap, back toward the nozzles, and back into each narrow gap. A heat exchanger exhausts heat from the housing and overall system, wherein vapor is condensed back to liquid phase during contact and heat transfer therewith. Condensed liquid is collected and re-pressurized for delivery back to the nozzles such that a sustained cooling operation is performed.

19 Claims, 17 Drawing Sheets

U.S. PATENT DOCUMENTS

| | | | |
|---|---|---|---|
| 7,301,772 B2 * | 11/2007 | Tilton et al. | 361/699 |
| 7,450,384 B2 * | 11/2008 | Tavassoli et al. | 361/699 |
| 2003/0172669 A1 * | 9/2003 | Tilton et al. | 62/310 |
| 2003/0193780 A1 * | 10/2003 | Morrow et al. | 361/700 |
| 2006/0026983 A1 | 2/2006 | Tilton et al. | |
| 2006/0126296 A1 | 6/2006 | Campbell et al. | |
| 2007/0169928 A1 | 7/2007 | Dayan et al. | |
| 2008/0123297 A1 | 5/2008 | Tilton et al. | |

* cited by examiner

NARROW GAP SPRAY COOLING IN A GLOBALLY COOLED ENCLOSURE

CROSS-REFERENCE TO RELATED APPLICATIONS

This application is a continuation-in-part of and claims priority to U.S. patent application Ser. No. 11/347,898, filed Feb. 6, 2006 entitled "Narrow Gap Spray Cooling in a Globally Cooled Enclosure," the entirety of which is incorporated herein by reference.

BACKGROUND

Various configurations of packaging and protecting electronic devices are known. Among others are those configurations (sometimes referred to as form factors) that are favored and/or required by military and industrial users wherein a plurality of electronic circuit boards are supported within a rack or cage-like assembly in a relatively dense arrangement. Some of these form factors have been developed by the IEEE (Institute of Electrical and Electronics Engineers, Inc.). In one scenario, a number of circuit boards are disposed in a parallel spaced relationship to one another and are surrounded by a protective, perhaps hermitically sealable, outer housing. Such an arrangement is directed to addressing a number of considerations such as, for example, protecting the electronic contents against mechanical shock and/or vibration, maintaining electrical interconnectivity between the circuit boards, protection against environmental contaminants, etc.

One point of concern that arises within such a configuration is the cooling of the electronic constituency during operation. This concern can be compounded by other factors such as ambient temperature, the required capacity to set up and dismantle the electronic equipment quickly (e.g., mobile use in an emergency or military field setting), availability (or lack) of external cooling options, etc. One approach to heat removal in this general sort of circumstance is described in U.S. Pat. No. 5,880,931 to Tilton et al. Therein, a Spray Cooled Circuit Card Cage is taught that incorporates atomized cooling fluid. Recently, it has become apparent that there are certain shortcomings when using the techniques as taught by Tilton. The teachings herein are directed to overcoming these and other disadvantages that occur while cooling densely-packed circuit cards within a protective housing.

SUMMARY

One embodiment provides for a system, including a first entity and a second entity that are respectively disposed such that they define a narrow gap between them. The system also includes at least one nozzle, wherein the nozzle is configured to spray an atomized liquid so that a flow of the atomized liquid and a vapor is induced through the narrow gap. The system also includes a heat exchanger that is configured to condense some of the vapor to liquid, the condensed vapor defining a condensate. The system further includes a housing configured to guide a circulation of at least some of the vapor, which is flowing out of the narrow gap, away from the heat exchanger and into proximity with the at least one nozzle.

Another embodiment provides for a system, the system comprising a housing configured to selectively open-ably enclose a plurality of electronic circuit boards. The system further includes a plurality of electronic circuit boards supported in the housing, wherein at least some of the electronic circuit boards are arranged to define respective pairs of boards. At least one pair of boards defines a narrow gap there between. The system also includes at least one nozzle associated with each narrow gap, each nozzle being configured to spray an atomized liquid into the narrow gap defined by the associated pair of boards. The housing is also configured to guide a circulation of a vapor exiting each narrow gap into proximity with the at least one nozzle associated with the at least one narrow gap.

Yet another embodiment provides an apparatus, the apparatus including a plurality of nozzles each configured to spray an atomized liquid. The plurality of nozzles is also arranged such that the spray of atomized liquid from each nozzle at least partially overlaps the spray of atomized liquid from at least one other nozzle. The apparatus further includes an electronic circuit board including a plurality of electronic components. The electronic circuit board is disposed in such a way that each of the electronic components is contactingly exposed to the spray of atomized liquid from at least one nozzle.

Still another embodiment provides an apparatus, the apparatus includes a nozzle configured to spray an atomized liquid in a generally conical distribution pattern. The apparatus further includes a re-shaper that is configured to reform the spray of atomized liquid into a generally planar distribution pattern.

Another embodiment provides a method, the method including the steps of providing a first electronic circuit board and a second electronic circuit board, and disposing the first and second electronic circuit boards such that a narrow gap is defined between them. The method also includes the step of spraying an atomized liquid such that a flow of the atomized liquid is induced through the narrow gap. The method further includes the step of transferring heat from at least one of the electronic circuit boards to the atomized liquid flowing through the narrow gap, such that at least some of the atomized liquid is vaporized. The method still further includes the step of circulating at least some of the vapor exiting the narrow gap into proximity with the spray of atomized liquid.

Yet another embodiment provides a method including the step of providing an electronic circuit board including a plurality of electronic components. The method also includes the step of spraying an atomized liquid as one or more generally conical distribution patterns. Other steps of the method include reforming each spray of atomized liquid into a generally planar distribution pattern, and contactingly exposing each of the plurality of electronic components to the atomized liquid of at least one of the generally planar distribution patterns.

Another embodiment provides a system, comprising a plurality of electronic circuit boards configured to define respective pairs of boards, wherein each pair of boards is disposed to define a narrow gap between them. Furthermore, a lesser-component-bearing side of each board faces into the narrow gap thus defined. The system also includes a plurality of nozzles corresponding to each pair of boards, wherein each nozzle configured to spray an atomized liquid such that a flow is induced through the narrow gap of the corresponding pair of boards. As such, at least some of the atomized liquid flowing through each narrow gap is vaporized by way of heat transfer from the corresponding pair of boards. The system also includes a spray collector corresponding to each pair of boards, wherein the spray collector configured to guide at least some of the spray of atomized liquid from the corresponding plurality of nozzles into the narrow gap. The system further includes a housing configured to guide a circulation of at least some of the vapor, exiting each narrow gap, into proximity with the plurality of nozzles corresponding to each narrow gap. Also included is a liquid collector configured to condense at least some of the vapor exiting each narrow gap to a liquid, thus defining a condensate. The system further includes a fluid conduit assembly configured to route the condensate collected by the liquid collector such that a source of liquid for each plurality of nozzles is defined.

These and other aspects and embodiments will now be described in detail with reference to the accompanying drawings, wherein:

DETAILED DESCRIPTION

In representative embodiments, the present teachings provide methods and apparatus for cooling electronic circuit boards and the like using ongoing circulations of liquid coolant and derived vapor. At least some of the particular aspects and advantages of the present teachings, as will be described in detail below, are summarized as follows:

1. Atomized liquid coolant flows through a narrow gap defined by a pair of electronic circuit boards, thus cooling heat dissipating electronic components supported on each;

2. A lesser-component-bearing side of an electronic circuit board can face into the narrow gap, thus reducing component cooling problems due to "shadowing";

3. Narrow gaps, for cooling purposes, can be defined by any suitable combination of electronic circuit boards, platen entities, and/or housing elements;

4. Heat exchangers are used to remove heat from within a corresponding housing by way of heat transfer into a suitable fluid media;

5. Wicking or capillary devices can be used to separate liquid from vapor during the heat removal process; and 6. Systems can be configured to take advantage of gravity during flow of atomized liquid coolant onto heat-dissipating devices and/or components, and/or during the collection of condensed vapors derived by such a cooling operation.

Figure 1:
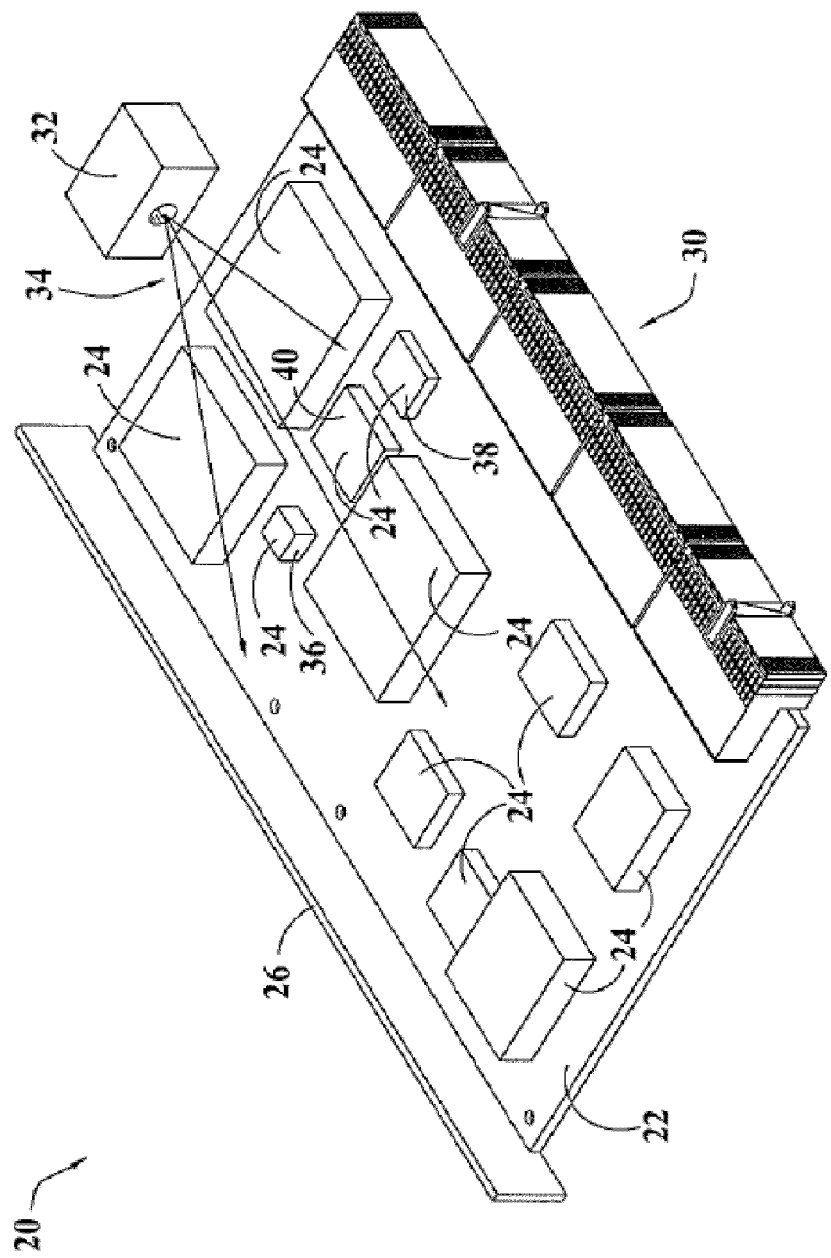
FIG. 1 is an isometric view depicting a system according to the prior art.

Turning now to FIG. 1, an isometric view depicts a system 20 according to the prior art. The system 20 includes an exemplary electronic circuit board (ECB) 22. The ECB 22 includes a plurality of electronic components 24. Each of the electronic components 24 can be respectively defined by a known type of device such as an integrated circuit, a transistor, a diode, a microprocessor, a microcontroller, a solid-state memory device, an RFID (i.e., radio frequency identification device) component, a resistor, a capacitor, etc. One of skill in the electrical engineering arts is aware of numerous types of electronic components 24 (discrete or integrated, etc.), and further elaboration is not required for purposes herein. It is to be understood that most, if not all, of the electronic components 24 dissipate some respective amount (rate) of heat during normal, electrically energized operation. Further discussion of this aspect of the ECB 22 is provided below.

The electronic circuit board 22 of FIG. 1 includes a front edge portion 26 that is attached to the remainder of the ECB 22 at a substantially right angle. The front edge portion 26 provides a means by which the ECB 22 can be manually grasped by a user during, for example, insertion or removal of the ECB 22 from an edge connector within an electronic rack assembly (not shown) or a larger electronic circuit board or device (not shown), etc. The ECB 22 also includes a row of plural connectors 30. Each connector 30 is understood to be electrically coupled to one or more of the respective electronic components 24. In this way, electrical coupling between the electronic components 24 and an external entity (another ECB or electrical device, etc., not shown).can be established and by way of coupling (i.e., mating) the connectors 30 of the ECB 22 to a row (or matrix) of complementary electrical connections (not shown). Again, one of skill in the electrical arts is aware of such connectors 30 and their corresponding electrical coupling arrangements, and further elaboration is not needed here. In any case, it is to be understood that the ECB 22 is configured to be selectively electrically coupled to, and removed from, another electrical and/or electronic entity (not shown).

The system 20 of FIG. 1 also includes a nozzle 32. The nozzle 32 is configured to provide a spray of atomized droplets (spray) 34 of preferably an electrically nonconductive coolant. As depicted in FIG. 1, the nozzle 32 is disposed with respect to the ECB 22 such that the spray 34 is generally directed (i.e., flows) over the ECB 22 such that most of the electronic components 24 are contactingly exposed to the atomized droplets of the spray 34. Heat is removed from at least some of the electronic components 24 by way of vaporization of the atomized droplet of the spray 34 such that a corresponding vapor is derived, the vapor in turn flowing away from the electronic components 24 by mixing or other interaction with the spray 34. Thus, cooling of at least some of the electronic components 24 is performed.

However, a typical electronic circuit board 22 is often configured such that one or more of the electronic components 24 thereon are obstructed, or "shadowed", by other typically larger electronic components 24 with respect to the spray 34 of coolant. Examples of such shadowed electronic components 24 are designated in FIG. 1 as components 36, 38 and 40, respectively. As a result, these shadowed components 36, 38 and 40 are deprived of some, or perhaps all, of the cooling effect that would otherwise be afforded to each by the spray 34. This "shadowing" problem can be compounded by the fact that certain ECB 22 configurations—i.e., arrangements of the electronic components 24 relative to one another—are desired or required by other non-cooling related considerations such as, for example, reduction or avoidance of radio frequency interference, placement for easy access or service, weight-balancing of the overall ECB 22, proximity between certain electronic components 24 so as to enable wireless communication there between, etc.

In other cases, it would be economically impractical (or virtually impossible) to reconfigure a particular ECB 22 in the interest of spray 34 cooling such as, for example, in the case of an older electronic circuit board 22 that is no longer in production or is inclusive of obsolete—but nonetheless required—electronic componentry or overall functionality. In short, the system 20 as depicted by FIG. 1 represents some of the short comings of the known art with respect to atomized droplet cooling of electronic circuitry. Reference is now directed to embodiments of the present teachings.

Figure 2A:
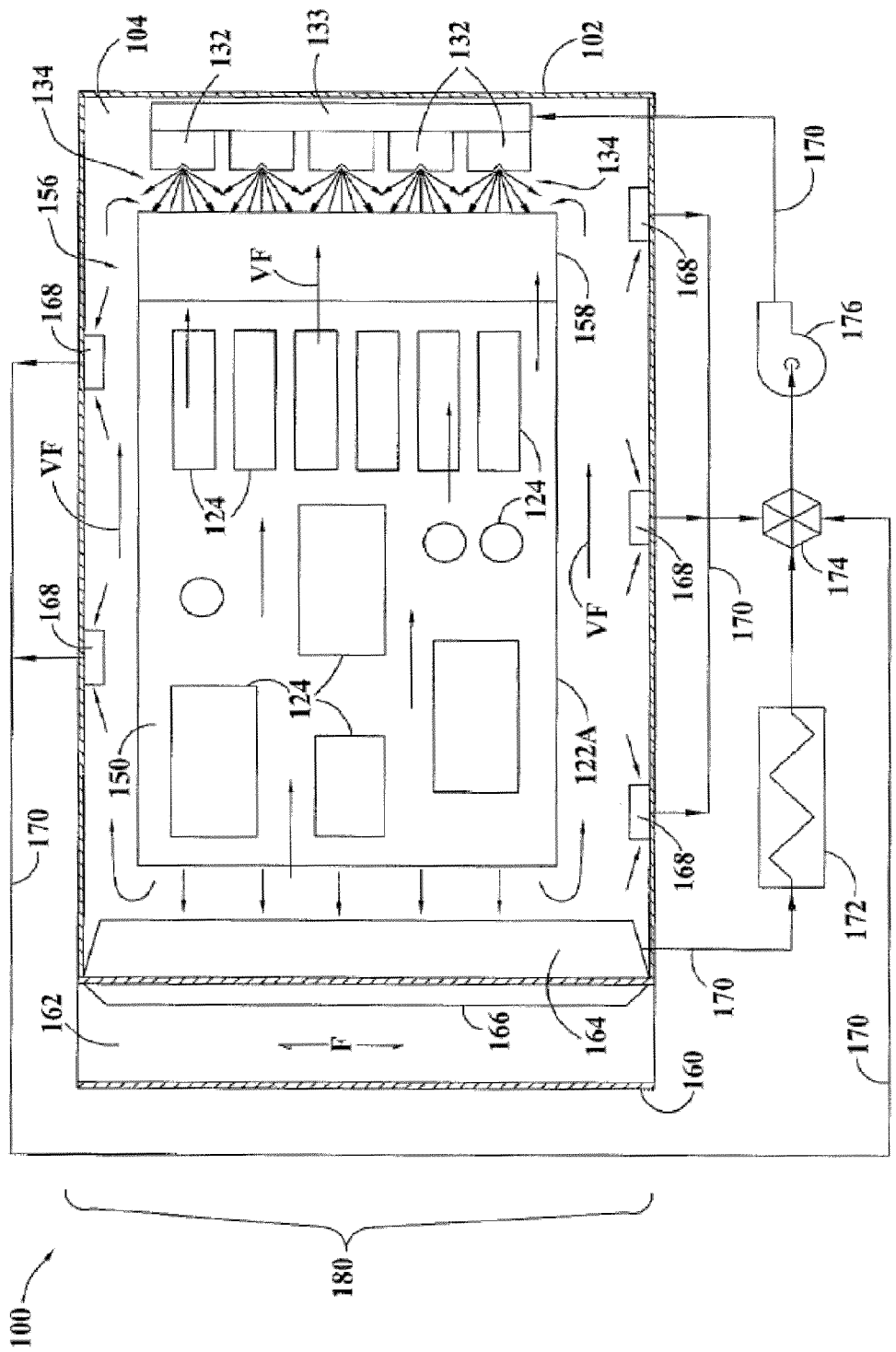
FIG. 2A is a side elevation sectional view depicting a system in accordance with an embodiment of the present teachings.
Figure 2B:
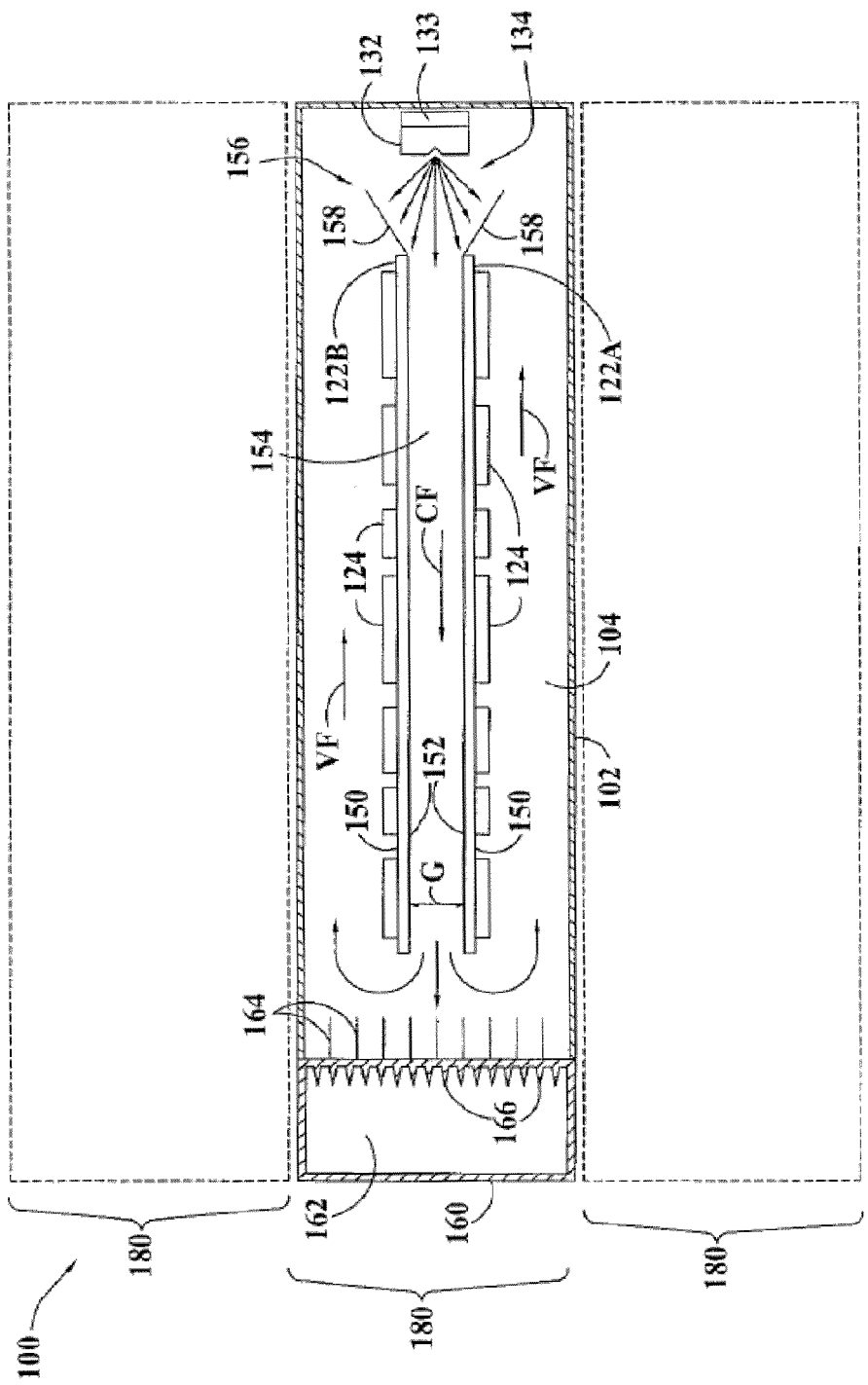
FIG. 2B is a plan sectional view depicting the system of FIG. 2A.

FIG. 2A is a side elevation sectional view depicting a system 100 in accordance with an embodiment of the present teachings. FIG. 2B is a plan sectional view depicting the system 100 of FIG. 2A. Reference is made to FIGS. 2A and 28 as directed below. The system 100 (FIGS. 2A, 2B) includes a housing 102. The housing 102 can be formed from any suitable material such as, for example, aluminum, plastic, fiberglass, stainless steel, etc. Other suitable materials can also be used. The housing 102 defines a selectively open-able and closable, substantially vapor-tight internal cavity (interior) 104.

The system 100 includes a respective pair of electronic circuit boards (ECBs) 122A and 122B (FIGS. 2A and 2B). Each of the ECBs 122A and 122B includes a respective plurality of electronic components 124 supported thereon. Each of the electronic components 124 can be respectively defined, for example, by a resistor, a capacitor, a diode, a transistor, an integrated circuit, a microprocessor, a microcontroller, a solid-state memory, a miniaturized magnetic disk drive, an RFID device, etc. The specific definitions and/or functions of the respective electronic components 124 are not relevant to an understanding of the present teachings. In any case, it is to be understood that several, and perhaps all, of the respective electronic components 124 of FIGS. 2A and 2B dissipate respective quantities (rates) of heat during normal, electrically energized operation. It is to be further understood that the ECB 122A and/or 122B can be coupled in electrical and/or signal communication with each other and/or an entity or entities outside of the housing 102 by way of suitable wiring assemblies, edge connectors, fiber optic pathways, etc. (not shown). The precise form of such electrical connecting and/or signal communicating means is not relevant to the purposes of the present teachings and has been omitted from FIGS. 2A and 2B in the interest of clarity. It is to be understood that the ECBs 122A and 122B are supported by a suitable rack or other similar structure (not shown). Such rack-like and other structures are well known in the electronic arts, and its depiction has been omitted here in the interest of clarity.

Each of the electronic circuit boards 122A and 122B is defined by a greater-component-bearing side 150 and a lesser-component-bearing side 152, in correspondence to the relative number of electronic components 124 (if any) borne or supported on that particular side. As depicted in FIG. 2B, there are substantially no electronic components 124 borne on the respective lesser-component-bearing sides 152 of ECBs 122A and 122B (however, electrically conductive pathways, or "traces", can be present). The terms "greater-component-bearing side" and "top side" are used interchangeably herein to refer to side 150, while the terms "lesser-component-bearing side" and "bottom side" are used interchangeably to refer to side 152, of any particular electronic circuit board (e.g., 122A, 122B, etc.). Thus, the bottom side 152 is substantially flat and smooth as compared to the respective top side 150 of each of the ECBs 122A and 122B. Except as otherwise described herein, It is to be understood that each of the ECBs 122A and 122B are formed and configured using generally standard, known techniques and materials and that as such, the specific present teachings are broadly applicable to various existing forms of electronic circuit board, as well as those of suitable future configuration.

As also depicted in FIG. 2B, the respective electronic circuit boards 122A and 122B are disposed and supported (i.e., configured) in parallel arrangement such that a relatively narrow gap 154 is defined there between. Furthermore, the ECBs 122A and 122B are configured such that the bottom (lesser-component-bearing) side 152 of each is facing into the narrow gap 154. In this way, the narrow gap 154 is substantially defined by the relatively smoother side 252 of the each of the ECBs 122A and 122B. The narrow gap 154 is defined by a gap spacing "G". In one embodiment, the gap spacing "G" is in the range of about 0.030 to about 0.040 inches. Other suitable embodiments of the system 100, defined by other gap spacings "G", can also used.

The system 100 of FIGS. 2A and 2B also includes a plurality of nozzles 132. Each nozzle 132 is configured to provide, or emit, a substantially conical spray 134 of atomized liquid (i.e., droplets), wherein such liquid is typically defined by an electrically non-conductive coolant. In this way, each of the nozzles 132 is also referred to as a fluid atomizer. A number of suitable embodiments of such fluid atomizer are described in detail in U.S. Pat. No. 5,860,602 and U.S. Pat. No. 6,016,969, and which are incorporated herein by reference in their entirety. A non-limiting example of a suitable electrically non-conductive coolant is Fluorinert (commonly sold as FC72, or PF5060) manufactured by 3M Company, St. Paul, Minn., USA. Other suitable coolants can also be used. Each of the nozzles 132 is supported by, and in fluid communication with, a liquid supply header 133. In one embodiment, the plurality of nozzles 132 and the liquid supply header 133 are formed as respective portions of a singular, one-piece entity. As depicted in FIG. 2A, the plurality of (specifically, five) nozzles 132 are arranged in a linear row and are respectively configured to direct the spray 134 of atomizer droplets into the narrow gap 154 defined by the electronic circuit boards 122A and 122B. Furthermore, the spray 134 from each nozzle 132 at least partially overlaps (intersects, or interacts with) the spray 134 of at least one other nozzle 132. The nozzles 132 are described in greater detail hereinafter in accordance with the typical operation of the system 100.

The system 100 of FIGS. 2A and 2B also includes a spray collector 156, which in turn is defined by a pair of respective plates 158. Each plate 158 is supported by, and defines an angle with respect to, a corresponding one of the electronic circuit boards 122A and 122B. The spray collector 156 is configured to direct, or guide, at least some of the spray 134 from each nozzle 132 into the narrow gap 154. Thus, the spray collector 156 is generally directed to improving the "capture" of atomized liquid (i.e., coolant droplets) that would otherwise fail to enter the narrow gap 154 (as defined by the ECBs 122A and 122B) by virtue of the substantially conical shape of each spray 134. Therefore, the overall mass flow of atomized liquid (i.e., via sprays 134) into the narrow gap 154 is increased by operation of the spray collector 156.

The system 100 of FIGS. 2A and 28 further includes a heat exchanger 160. The heat exchanger 160 can be formed from any suitable material such as, for example, aluminum, stainless steel, brass, gold-plating over a suitable base metal, etc. Other suitable materials can also be used to form the heat exchanger 160. The heat exchanger 160 is configured to transfer heat away from the interior 104 (and elements supported therein) of the housing 102. The heat exchanger 160 defines a central passageway or conduit 162, configured to route a suitable fluid media there through (in either direction "F" as depicted in FIG. 2A), such that heat is carried or transferred away from the heat exchanger 160 (and ultimately, the interior 104 of the housing 102) during normal operation. Non-limiting examples of such a fluid media include air, nitrogen gas, oil (such as PAO), water, alcohol, vehicle fuel, silicone fluid, an azeotrope (such as OS-120 available from the Dow Corning Corporation, Michigan, USA), etc.

The heat exchanger 160 is defined by a plurality of condenser fins 164 and a plurality of interior fins 166, respectively configured to increase heat transfer from within the housing 102 into the fluid media (not shown) flowing within the central conduit 162. Further operational details of the heat exchanger 160 are described hereinafter. It is to be understood that the heat exchanger 160 is configured to be mechanically coupled or mated to the housing 102 so as provide a substantially vapor-tight seal therewith. In turn, the interior cavity 104 defines a substantially hermetically sealed chamber when the housing 102 and heat exchanger 160 are thus coupled. In this way, a substantially fluid-tight and contaminant free environment is provided for supporting, operating and cooling the electronic circuit boards 122A and 122B therein.

The system 100 (see FIG. 2A) also includes one or more attitude-independent (AI) valves 168. Each AI valve 168 is configured to receive (collect) liquid from within the housing 102 and to route that liquid into a fluid conduit network 170. Typically, such liquid is defined by a condensing vapor derived during the process of cooling the electronic circuit boards 122A and 122B via each spray 134. Such condensed vapor is also referred to herein as a condensate. Further elaboration of the liquid collection and routing process is provided hereinafter.

The system 100 (see FIG. 2A) further includes a vapor-to-condensate condenser (condenser) 172. The condenser 172 is fluidly coupled to the interior 104 of the housing 102 by way of a corresponding portion of the fluid conduit network 170. As depicted in FIG. 2A, the condenser 172 and associated conduit 170 are configured to receive vapors and/or liquid from within the housing from, at, or proximate to the heat exchanger 160. In another embodiment (not shown in FIGS. 2A or 2B), the condenser 172 receives vapor and/or liquid from another location or locations within the housing 102. In any case, the condenser 172 is configured to cool (i.e., condense) any received vapors back to liquid phase, thus defining a condensate. In this way, the condenser 172 functions as a heat exchanger in its own right.

The system 100 (see FIG. 2A) also includes combiner 174 that is configured to receive liquid (i.e., condensate) from the AI valves 168 and the condenser 172, as plurality of such liquid streams, and to route that liquid on as a single stream to a pump 176. The pump 176 is configured to receive the flow of liquid (condensate) from the combiner 174 and to discharge that liquid (typically, an electrically non-conductive coolant) as a pressurized stream (or source) to the plurality of nozzles 132 by way of the fluid conduit network 170. Thus, the pump 176 is fluidly coupled to the plurality of nozzles 132 and the liquid supply header 133. In accordance with the foregoing, the plurality of AI valves 168, fluid conduit network 170, the condenser 172, the combiner 174 and the pump 176, define a generally closed-loop liquid re-circulating system, in combination with the liquid supply header 133, the plurality of nozzles 132, and the interior 104 of the housing 102.

Typical operation of the system 100 is described as follows, wherein concurrent reference is made to FIGS. 2A and 2B: To begin, it is assumed that the electronic circuit boards 122A and 1228 are electrically energized and thus operational for their respectively intended purposes. Also, it is assumed that the pump 176 is operating and supplying a flow of pressurized electrically non-conductive coolant (hereinafter, coolant) to the liquid supply header 133. In turn, each nozzle 132 is emitting a spray 134 of atomized liquid coolant toward the narrow gap 154 defined by the ECBs 122A and 122B.

As a result of the foregoing, a flow of coolant "CF" (see FIG. 2B) is induced, or driven, through the narrow gap 154. Contemporaneously, heat is transferred from various (or all) of the electronic components 124 through the respective ECBs 122A and 1228 and toward the lesser-component-bearing side 152 of each. In turn, at least some of the coolant droplets of the flow "CF" come into direct contact with the respective bottom sides 152 of the ECBs (122A and 1228) and are vaporized by the heat transferred thereto. Thus, a vapor is derived by way of heat transfer from a particular ECB 122A and/or 1228, while the respective electronic components 124 thereon are subject to a correspondent cooling effect. The newly-formed vapors and as-yet non-vaporized coolant droplets continue to flow away from the nozzles 132, while vaporization and component cooling transpires throughout most (or all) of the narrow gap 154.

A flow of the vapors and non-vaporized coolant droplets exits the narrow gap 154 proximate the heat exchanger 160. As a result, the bulk of the non-vaporized coolant droplets and at least some of the vapors impinge on the condenser fins 164, resulting in a transfer of heat to the heat exchanger 160. In response, at least some of these impinging vapors are condensed back to liquid phase, thus defining a condensate (essentially, the coolant back in liquid form). This condensate, as well as the coolant droplets that are striking the condenser fins 164 of the heat exchanger 160, are drawn by gravity to a generally lower portion of the housing 102 proximate the AI valves 168 (or other fluid return pickup devices (not shown in FIGS. 2A-25). It is to be understood that the orientation of the system 100 can vary with respect to gravity in accordance with particular usage conditions, and that AI valves 168 can be respectively provided and disposed in order to accommodate these changing and/or unpredictable usage conditions (e.g., operation of an embodiment of the system 100 onboard a ship during pitching and rolling in rough seas, etc.). This flow of liquid (i.e., condensate, etc.) is received by the AI valves 168, while some of the vapors are received by the condenser 172, via the fluid conduit network 170. From there, the liquid coolant (condensate) is routed to the combiner 174 and then onward to the pump 176. At this point, the routed liquid has returned to its previously described point of origin, to being another journey around the closed-loop liquid circulation system. The heat transferred to the heat exchanger 160 (by way of impinging vapors and non-vaporized coolant droplets) is in turn transferred to the fluid media flow "F" (see FIG. 2A), and is ultimately exhausted away from the system 100.

Contemporaneous with the liquid circulation just described above, at least some of the vapors exiting the narrow gap do not impinge on the heat exchanger 160, or are subjected to insufficient heat transfer when in thermal communication with the heat exchanger 160 (due to insufficient contact time, etc.) in order to be condensed to liquid state. These vapors are driven by the force of the respective sprays 134 and guided by the housing 102 to recirculate as a flow of vapors "VF" generally along the respective top sides 150 of the ECBs 122A and 122B and back into proximity with the plurality of nozzles 132. There, at least some of the vapors combine with the sprays 134 of atomized liquid droplets and are drawn back into the narrow gap 154. Thus, a continuous recirculation of vapor is realized through the narrow gap 154, along the tops sides 150 of the ECBs 122A and 122B, and back into the narrow gap 154 during normal operation of the system 100 of FIGS. 2A and 2B. This has the effect of enhancing the heat transfer of the spray there through. In accordance with the foregoing, a complete typical operation of the system 100 has been described.

It is to be understood that in one or more embodiments according to the present teachings, the housing 102, ECBs 122A and 122B, nozzles 132, heat exchanger 160 and AI valves 168 are configured to define a single cartridge or module 180. Furthermore, it is to be understood that a plurality of such cartridges 180 can be further configured to be assembled into, or disassembled from, a stacked or side-by-side arrangement with each other during operation, service and use. Other combinations (not shown) of these and/or other elements of the present teachings can be suitably defined and used as a cartridge or "modular unit" (e.g., 180, etc.). While the plural nozzles 132 depicted in FIGS. 2A and 2B are arranged as a linear row, it is to be understood that other embodiments (not shown) can also be defined and used wherein the plural nozzles 132 (e.g., as associated with a particular narrow gap 154, etc.) are arranged in a staggered or zigzag pattern, a curvilinear arc, a two dimensional array, etc. Any such desirable pattern or arrangement (linear row, arc, or otherwise) of nozzles 132 is referred to hereinafter as an "array".

It is also to be understood that other embodiments (not shown) can be defined and used, wherein at least some of the vapors (and non-vaporized droplets) exiting each narrow gap impinge upon a substantially "fin-less" condensing structure such as, for example, a diamond foam, a surface coated in graphite or diamond paint, a structure of carbon nanotubes, etc., or any other suitable, highly thermally conductive material or assemblage. Thus, other embodiments in accordance with the present teachings can be used to transfer heat out of the corresponding housing (e.g., 102, etc.) resulting in a flow of condensate (liquid coolant) that can be further cooled and/or re-circulated substantially as described above.

Figure 3:
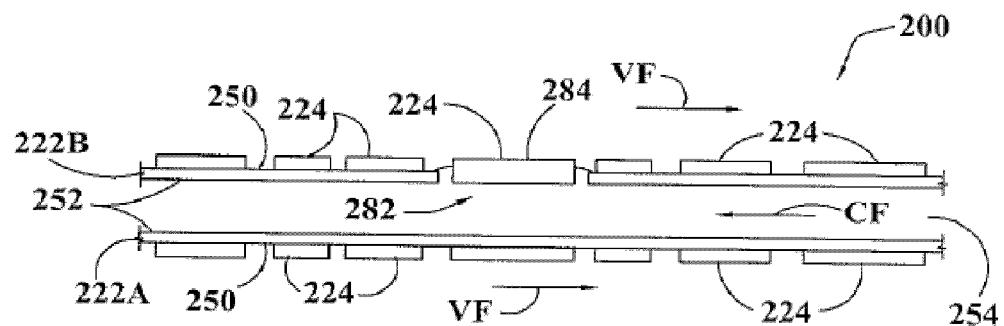
FIG. 3 is a plan view depicting details of a system in accordance with another embodiment.

FIG. 3 is a plan view depicting details of a system 200 in accordance with another embodiment. The system 200 includes a pair of electronic circuit boards 222A and 222B, respectively. Each of the ECBs 222A and 222B include (support, or bear) a respective plurality of electronic components 224, wherein each electronic component 224 is arbitrarily defined as described above in regard to the electronic components 124 of FIGS. 2A and 2B. Furthermore, it is assumed that each of the electronic components 224 of FIG. 3 dissipates some respective rate of heat during normal, electrically energized operation. As also depicted in FIG. 3, each ECB 222A and 222B defines a greater-component-bearing side 250, and a lesser-component-bearing side 252. The ECBs 222A and 222B are disposed in parallel orientation such that a narrow gap 254 is defined there between, wherein the respective lesser-component-bearing sides 252 face therein.

It is to be understood that a flow of coolant (i.e., atomized liquid) "CF" is induced or driven through the narrow gap 254, while a flow of vapor "VF" circulates through and about the narrow gap 254, such that the electronic components 224 are cooled substantially as described above with respect to the system 100 of FIGS. 2A and 2B.

As also depicted in FIG. 3, the electronic circuit board 222B defines a through aperture 282. The ECB 222B includes an electronic component 224 that is supported within the through aperture 282, thus defining a suspended electronic component (SEC) 284. In this way, the SEC 284 is in direct contacting exposure to the flow of atomized liquid "CF" (coolant) within the narrow gap 254. As a result, the SEC 284 is subjected to a greater cooling effect (i.e., increased heat transfer rate) relative to the other electronic components 254 of either of electronic circuit boards 222A or 222B. The suspended-in-aperture configuration embodied by ECB 222B provides at least one means for increasing the cooling effect required or desired for particular, selected electronic devices (e.g., 284, etc.), relative to other electronic components (e.g., 224, etc.) common to a particular ECB, or increases cooling of other components by eliminating the shadowing referred to earlier, such as in the case of System 400 described hereinafter. Non-limiting examples of such suspended electronic components 284 include microprocessors, microcontrollers, RF modulators, miniaturized motors, etc. It is be understood that, while ECB 222B depicts only one such suspended electronic component 284, this singularity is not to be taken as an absolute limitation. Rather, any suitable number of such SECs can be borne by any particular electronic circuit board. In another embodiment (not shown), an SEC (e.g., 284, etc.) is arranged so as to reduce the profile of that electronic component with respect to coolant being sprayed toward (i.e., generally over) a greater-component-bearing side of the corresponding electronic circuit board. Thus, such an embodiment (not shown) includes one or more electronic components supported within corresponding through apertures so that an overall "leveling" or "equalizing" of the respective component profiles is achieved.

Figure 4:
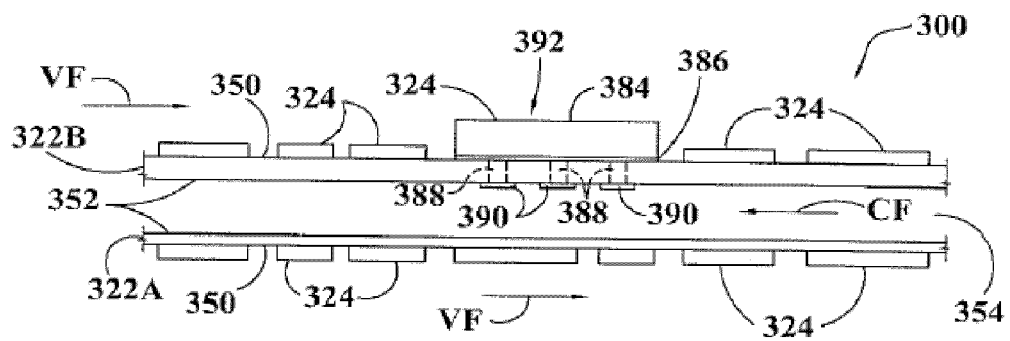
FIG. 4 is a plan view depicting details of a system in accordance with yet another embodiment.

FIG. 4 is a plan view depicting details of a system 300 in accordance with yet another embodiment. The system 300 includes a pair of electronic circuit boards 322A and 322B, respectively. Each of the ECBs 322A and 322B include (support, or bear) a respective plurality of electronic components 324, wherein each electronic component 324 is arbitrarily defined as described above in regard to the electronic components 124 of FIGS. 2A and 2B. Furthermore, it is assumed that each of the electronic components 324 of FIG. 4 dissipates heat at some respective rate during normal, electrically energized operation. As also depicted in FIG. 4, each ECB 322A and 322B defines a greater-component-bearing side 350, and a lesser-component-bearing side 352. The ECBs 322A and 322B are disposed in parallel orientation such that a narrow gap 354 is defined there between, wherein the respective lesser-component-bearing sides 352 face into the narrow gap 354. It is to be understood that a flow of atomized liquid (i.e., coolant) "CF" is induced or driven through the narrow gap 354, while a flow of vapor "VF" circulates though and about (i.e., external to) the narrow gap 354, such that the electronic components 324 are cooled substantially as described above with respect to the system 100 of FIGS. 2A and 2B.

As also depicted in FIG. 4, the electronic circuit board 322B includes a particular electronic component 324 that is further designated as electronic component 384. The electronic component 384 is in thermal contact with an underlying thermal pad 386. The thermal pad 386 can be formed from any suitable, thermally conductive material such as aluminum brass, a gold-plated base metal, etc. One of skill in the electrical engineering arts is familiar with various metals and other materials suitable for conducting heat away from energized, heat dissipating electronic devices, and can select a suitable such material for use in a particular embodiment. As depicted in FIG. 4, the electronic component 384 is in direct contact with the thermal pad 386.

The thermal pad 386 is in thermal communication with a plurality of thermal conductors 388. As depicted in FIG. 4, there are a total of three thermal conductors 388 present. However, it is to be understood that any suitable number (one or more, etc.) of thermal conductors (e.g., 388, etc.) can be present. Each thermal conductor is assumed to be formed from the same material as used to form the thermal pad 386. In one embodiment, the thermal pad 386 and the plural thermal conductors 388 are defined by respective portions of a single, one-piece entity. Other embodiments corresponding to other configurations of thermal conductors 388 can also be used. As also depicted in FIG. 4, each thermal conductor 388 is defined by a solid cylindrical entity extending from the thermal pad 386. Other suitable geometries (not shown) of thermal conductor 388 can also be used such as, for example, conical or otherwise tapered extensions, extensions of square, triangular, hexagonal, (etc.) cross-section, and so on. In any case, each thermal conductor 388 occupies a through aperture defined by the ECB 3226, and is configured to conduct heat away from the thermal pad 386 toward the lesser-component-bearing side 352 of the ECB 322B.

As also depicted in FIG. 4, the system 300 includes a plurality of thermal emitters 390 in one-to-one correspondence with the plurality of thermal conductors 388. Each thermal emitter is typically formed from the same material as that of the thermal pad 386 and/or thermal conductors 388 (e.g., aluminum, brass, gold-plated metal, etc.). As depicted in FIG. 4, each thermal emitter 390 is defined by a generally flat, solid disk-like entity lying on (or alternatively, inset flush with) side 352 of the ECB 322B. However, other thermal emitter geometries (not shown) and/or mounting arrangements can also be used such as, for example, fin-like protrusions, hemispherical dots or "bumps", etc. Each thermal emitter is in contacting exposure to the flow of (atomized liquid) coolant "CF" within the narrow gap 354. The thermal pad 386, the plural thermal conductors 388 and the plural thermal emitters 390 are collectively referred to as a "thermal via" 392.

During typical operation, heat is transferred from the electronic component 384 to the flow of coolant "CF" by way of direct conduction through the thermal pad 386, the plural thermal conductors 388, and the plural thermal emitters 390. In turn, a relatively greater rate of heat transfer from (i.e., overall cooling of) the electronic component 384 is achieved as compared to that of the other electronic components 324. This makes use of the thermal via 392 advantageous in particular situations such as, for example, cooling microprocessors or microcontrollers, cooling miniaturized motors, etc., or other high-heat dissipating devices.

Figure 5:
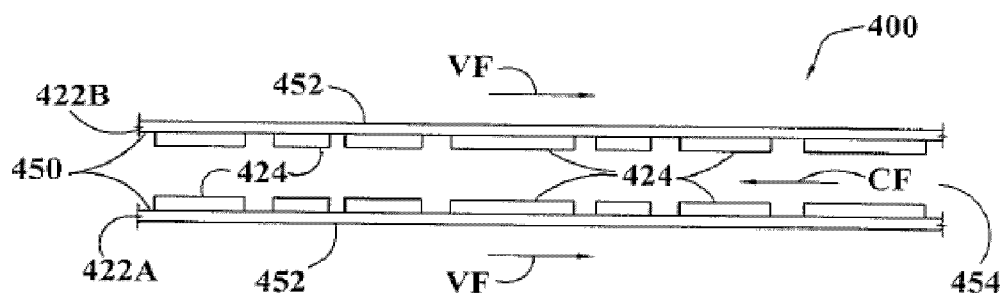
FIG. 5 is a plan view depicting details of a system in accordance with still another embodiment.

FIG. 5 is a plan view depicting details of a system 400 in accordance with yet another embodiment. The system 400 includes a pair of electronic circuit boards (ECBs) 422A and 422B, respectively. Each of the ECBs 422A and 422B include a respective plurality of electronic components 424, wherein each electronic component 424 is arbitrarily defined as described above in regard to the electronic components 124 of FIGS. 2A and 2B. It is assumed that each of the electronic components 424 of FIG. 5 dissipates heat at some respective rate during normal, electrically energized operation. As also depicted in FIG. 4, each ECB 422A and 422B defines a greater-component-bearing side 450, and a lesser-component-bearing side 452.

The ECBs 422A and 4228 are disposed in parallel orientation such that a narrow gap 454 is defined there between, wherein the respective greater-component-bearing sides 450 face into the narrow gap 454. This into-the-narrow-gap facing arrangement as depicted in FIG. 5 is notably different than those of the systems 100, 200 and 300 as described above in regard to FIGS. 2A and 2B, 3, and 4, respectively. It is to be understood that a flow of atomized liquid (i.e., coolant) "CF" is driven (or induced) through the narrow gap 454, while a flow of vapor "VF" circulates through, and about the outside of, the narrow gap 454. In this way, the electronic components 424 of system 400 are cooled to a notable extent by direct contacting exposure to the flow "CF" of atomized liquid, rather than by thermal transfer (conduction) through the respective ECBs 422A and 422B. The system 400 of FIG. 5 depicts that such direct exposure cooling of electronic devices can be used, if desired, in accordance with particular embodiments of the present teachings. None the less, it is important to note that the narrow gap 454 directs or channels the flow "CF" of coolant (atomized liquid) just as in the case of the systems 100, 200 and 300 as respectively described above.

Figure 6A:
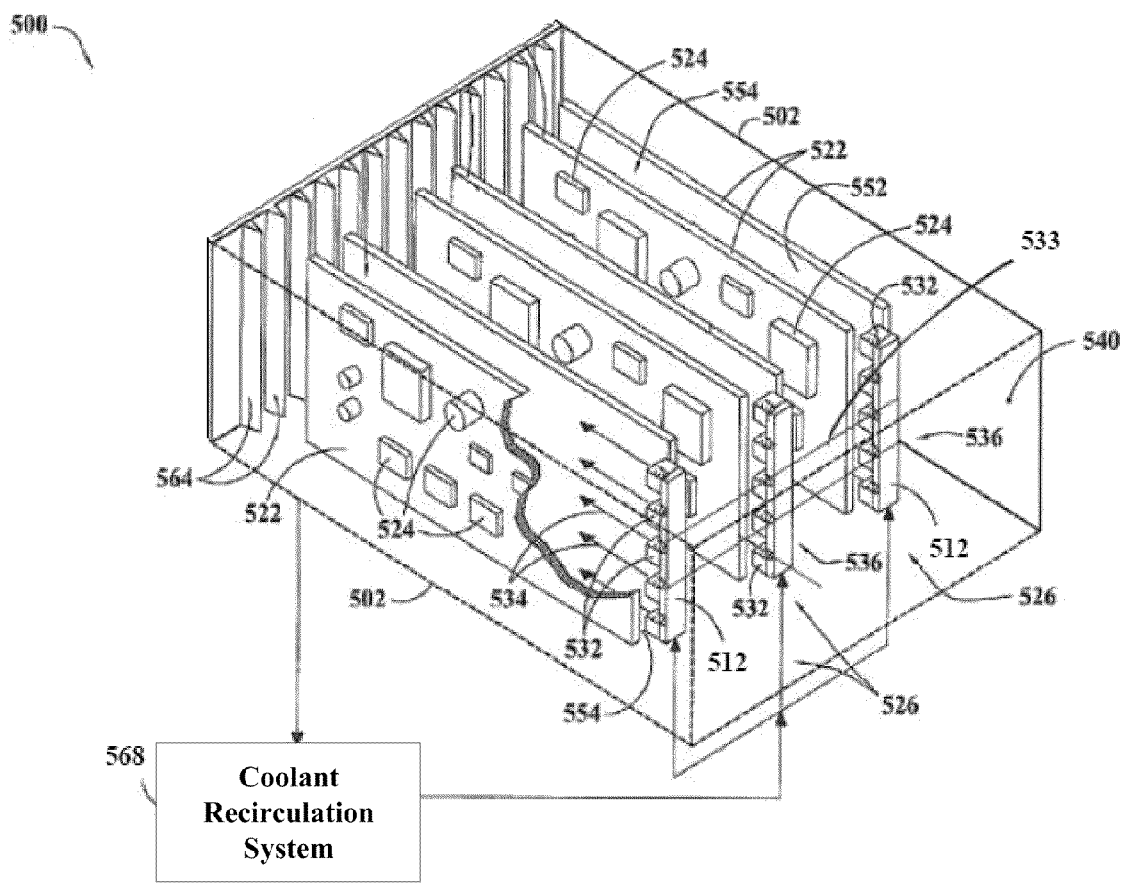
FIG. 6A is a partial cutaway isometric view depicting a system in accordance with another embodiment.

FIG. 6A is a partial cutaway isometric view depicting a system 500 in accordance with another embodiment of the present teachings. The system 500 includes a housing 502. As depicted in FIG. 6A, the housing 502 is partially presented in hidden line form. The housing 502 can be formed from any suitable material or combination of materials such as, for example, aluminum, stainless steel, plastic, synthetic fiber composites, fiberglass, etc. One of skill in the mechanical engineering or industrial design arts is familiar with any number of suitable configurations and methods for forming such housings, and further elaboration is not required for purposes of understanding the present teachings. As depicted in FIG. 6A, the housing 502 is defined by a front panel region 540.

Figure 6B:
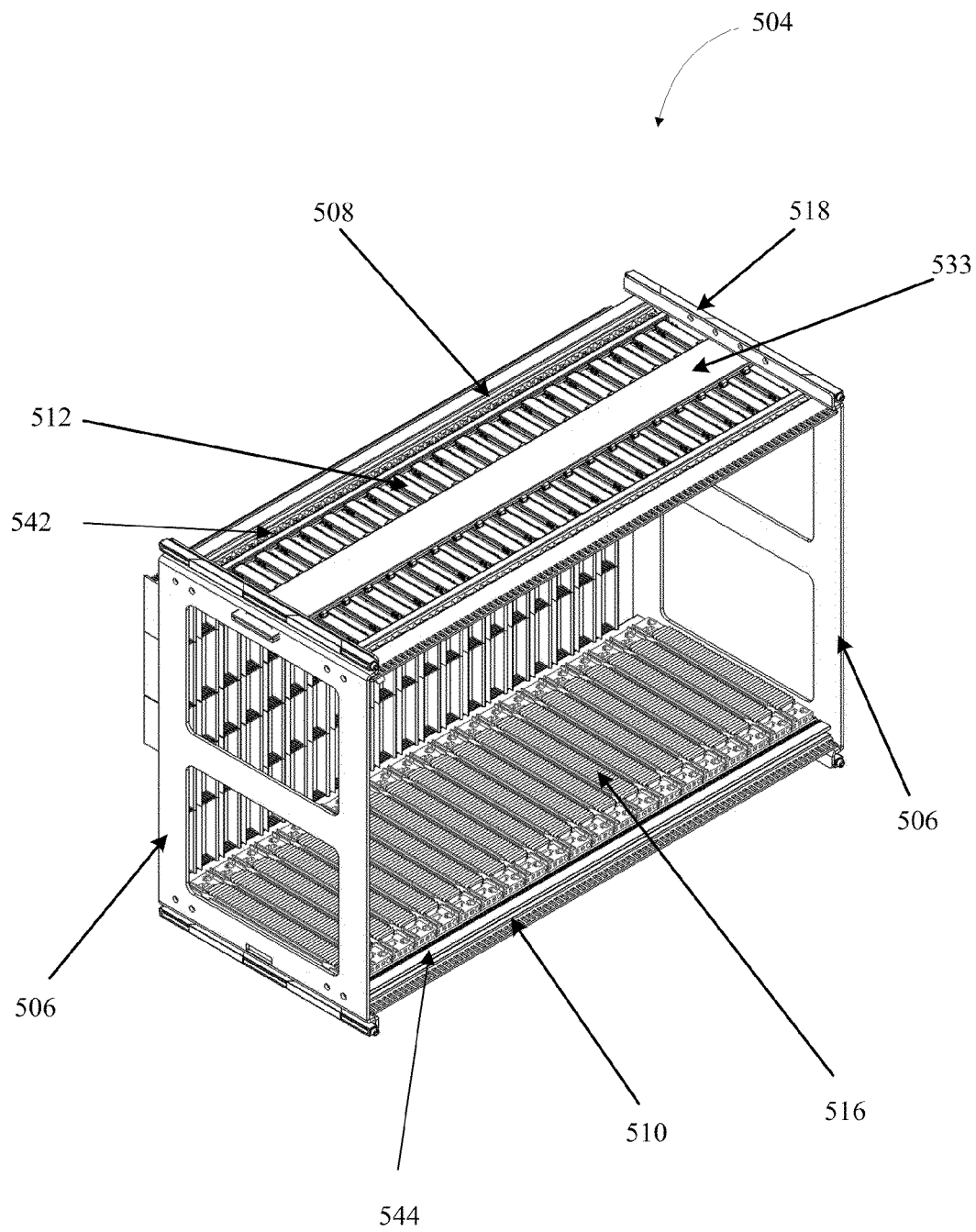
FIG. 6B is an isometric view of a card cage that incorporates spray cooling.

The system 500 may also include a card cage (e.g., a card cage 504 as shown in FIG. 6B) containing a plurality of electronic circuit boards (ECBs) 522, wherein FIG. 6A depicts one of the ECBs 522 in partial cutaway view in the interest of clarity. The ECBs 522 are arranged as respective pairs 526. In turn, each pair 526 of ECBs 522 is respectively disposed to define a narrow gap 554 there between. Each of the electronic circuit boards 522 supports a respective number of electronic components 524. The specific identity and function of each of the electronic components 524 is not critical to the present teachings, and each can be respectively defined by an integrated circuit, a transistor, a resistor, a microprocessor, etc. As depicted in FIG. 6A, each of the ECBs 522 may be arranged such that the lesser component-bearing side 552 faces into the associated narrow gap 554, either one or both ECBs 522 may be arranged such that the greater component bearing side faces into the associated narrow gap 554. It is to be understood, in accordance with analogous teachings described above, that each of the electronic components 524 dissipates a corresponding amount of heat during normal, energized operation and that such heat can be transferred through each corresponding ECB 522 toward the lesser component-bearing side 552 thereof. While not depicted in FIG. 6A, it is to be understood that the system 500 further includes whatever suitable means (e.g., wiring harnesses, backplanes, optical signal pathways, etc.) are necessary to couple the various ECBs 522 in electrical and/or signal communication with each other, and/or an entity or entities (not shown) external to the housing 502. Non-limiting examples of such external entities can include power supplies, user interface devices, radio receiving and/or transmitting devices, antennas, optical detection arrays, etc. Again, the specific form of such internal and/or external device coupling is not salient to the present teachings, and has been omitted in the interest of simplicity and clarity of understanding. It is to be further understood that a suitable rack or other support structure (not shown) is provided to support each of the ECBs 524 in the arrangement depicted in FIG. 6A. Such support structure can be of any suitable known type or in accordance with other of the present teachings, and is not included here in the interest of clarity.

The system 500 of FIG. 6A further includes a plurality of nozzles 532. The plurality of nozzles 532 is formed within the spray manifold assembly 512. The spray manifold assembly 512 is supplied with coolant through the fluid distribution manifold or the liquid supply header (LSH) 533. In this way, a plurality of linear rows (i.e., arrays) of nozzles 536 is defined. As depicted in FIG. 6A, a total of three such rows 536 are present. It is to be understood that other embodiments can also be defined and used that provide correspondingly different numbers of rows 536 of nozzles 532. In any case, each of the nozzles 532 is configured to emit a spray 534 of atomized liquid into the corresponding narrow gap 554. Such a liquid is defined by a suitable electrically non-conductive coolant such as, for example, any of those described above in regard to the system 100 of FIGS. 2A and 2B, etc. The atomized liquid flows through the narrow gap and impinges on the capillary structure or capillary filter 564. The capillary 564 filters out unwanted fluids and particles, such as oil, water, other foreign liquids or contaminants, and the like.

The system 500 of FIG. 6A further includes a coolant recirculation system (CRS) 568. The CRS 568 can be comprised of any suitable componentry as required or desired to receive liquid (i.e., condensate, or condensed vapor) and/or vapor from within the housing 502, and to provide a pressurized stream of coolant to the nozzles 532, during normal ECB 522 cooling operations of the system 500. Thus, the CRS 568 can include, for example, a condenser, a combiner, a pump, and/or one or more valves (or attitude-independent valves), etc., each defined substantially as described above in regard to the elements 172, 174, 176 and 168, respectively, of the system 100 of FIG. 2A. The CRS 568 is presented as a functional block in FIG. 6A in the interest of simplicity of understanding.

As depicted in FIG. 6A, the front panel region 540 of the housing 502 is disposed at generally the same elevation (with respect to gravity) as the plural electronic circuit boards 522, etc. However, it is to be understood that the system 500 can be oriented, configured and/or used such that the front panel region 540 of the housing 502 overlies the plural electronic circuit board 522 etc., so as to improve the gravity-induced flow of coolant over the electronic components 524 and towards the exit of the narrow gap 554 for recovery by the CRS 568. Other configurations and orientations (not shown) which take advantage of the assistance of gravity can also be defined and used in accordance with the present teachings.

Typical operation of the system 500 is substantially analogous to that described above in regard to the system 100 of FIGS. 2A and 2B. Thus, each of the nozzles 532 provides a spray 534 of atomized liquid (i.e., non-electrically conductive coolant) into the corresponding narrow gap 554. In turn, each spray from a nozzle 532 is contactingly exposed to the lesser component-bearing sides 552 and/or the greater component bearing sides of the ECBs 522 defining that particular narrow gap 554, and cooling of the ECBs 522 is provided primarily by way of evaporation of the liquid coolant droplets. The resulting vapors and any non-vaporized coolant droplets eventually flow out of each narrow gap 554, wherein the flow impinges on the capillary structure 564, where at least some of the non-vaporized liquid droplets collect thereon. The capillary dimensions are sized to preferably capture fluids with higher viscosity than the coolant, such as oils, water and aqueous solutions. The unvaporized coolant flow is directed (usually under the influence of gravity) toward collection by the CRS 568. The CRS 568 then re-pressurizes the collected liquid (condensate) and provides it as a generally cooled stream back to the plurality of nozzles 532 by way of the LSHs 533.

Contemporaneously, a circulation of vapor (not shown) occurs within the housing 502 in two parts, first as a flow of vapors out of each narrow gap 554, along the ECBs 522 and back into proximity with the respective nozzles 532, where the vapor circulatory path begins again. Secondly the majority of the vapor flow exits the housing 502 via either AI valves 168 or alternative vapor exit ports to be condensed in condenser 172 and returned to the pump inlet through combiner 174. The heat thus transferred is eventually exhausted from the system 500 by way of a suitable fluid media (not shown) flowing through or over condenser 172. In the foregoing way, overall operation of the system 500 of FIG. 6A is substantially the same as that of the system 100 of FIG. 2A.

As depicted in FIG. 6A, the system 500 represents at least one embodiment according to the present teachings wherein a plurality of pairs 526 of electronic circuit boards 522 can be environmentally shielded and cooled within a single housing 502. While the system 500 of FIG. 6A depicts a total of six ECBs 522, it is to be understood that other embodiments (not shown) can also be defined and used that include respectively varying numbers of ECBs 522. Thus, the system 500 depicted in FIG. 6A is an exemplary embodiment of overall principles that are widely applicable and suitably variable within the scope of the present teachings.

It is also to be understood that other elements provided by the present teachings can be suitably incorporated into other embodiments (not shown) of, or variations on, the system 500. For example, a suitably configured spray collector (e.g., the spray collector 156 of FIGS. 2A and 2B) can be incorporated for use in cooperation with each pair 526 of ECBs 522, thus improving the "capture" of the associated sprays 534 and overall efficacy of the corresponding cooling operation. FIGS. 6B through 6H described below provide further details of system 500.

FIG. 6B depicts details of the card cage in system 500. The card cage 504 is shown with two endplates 506, two back rails 508 and two front rails 510. While other types of rails may be employed, one embodiment uses rails manufactured by Elma Group™, Inc. for the back rails 508 and the front rails 510. In addition, the card cage 504 contains a number of spray manifold assemblies 512. The spray manifold assemblies 512 are inserted in the top of the card cage 504, one to each ECB slot. An LSH 533 is connected to the multiple spray manifold assemblies 512. In one embodiment, the LSH 533 may be made of a plastic material cut to length by, for example, a laser. A coolant may then flow into the LSH 533 and then into the multiple spray manifold assemblies 512. A non-limiting example of a suitable electrically non-conductive coolant is Fluorinert® (commonly sold as PF5070) manufactured by 3M® Company, St. Paul, Minn., USA.) Other suitable coolants can also be used. Subsequent figures describe the spray manifold assembly 512 in more detail.

As illustrated, the card cage 504 also employs card guides 516 to enable insertion of printed circuit boards into the card cage 504. One embodiment uses card guides manufactured by Elma Group™, Inc. In addition, wedge locks 518 are located on each end of the back rails 508 to provide for securing the card cage 504 into housing 502. The wedge locks 518 also connect the end plates 506 and the end rails 508 on one side of the card cage 504 and the end plates 506 and the front rails 510 on the other side of the card cage 504. Card cage 504 is slide-ably engaged in chassis 502, and wedge locks 518 then secure card cage 504 in place. This description has disclosed one embodiment, however, it is to be understood that many different configurations using the same components may be used. For instance, the spray manifold assembly and the spray collector may be one component in another embodiment.

Figure 6C:
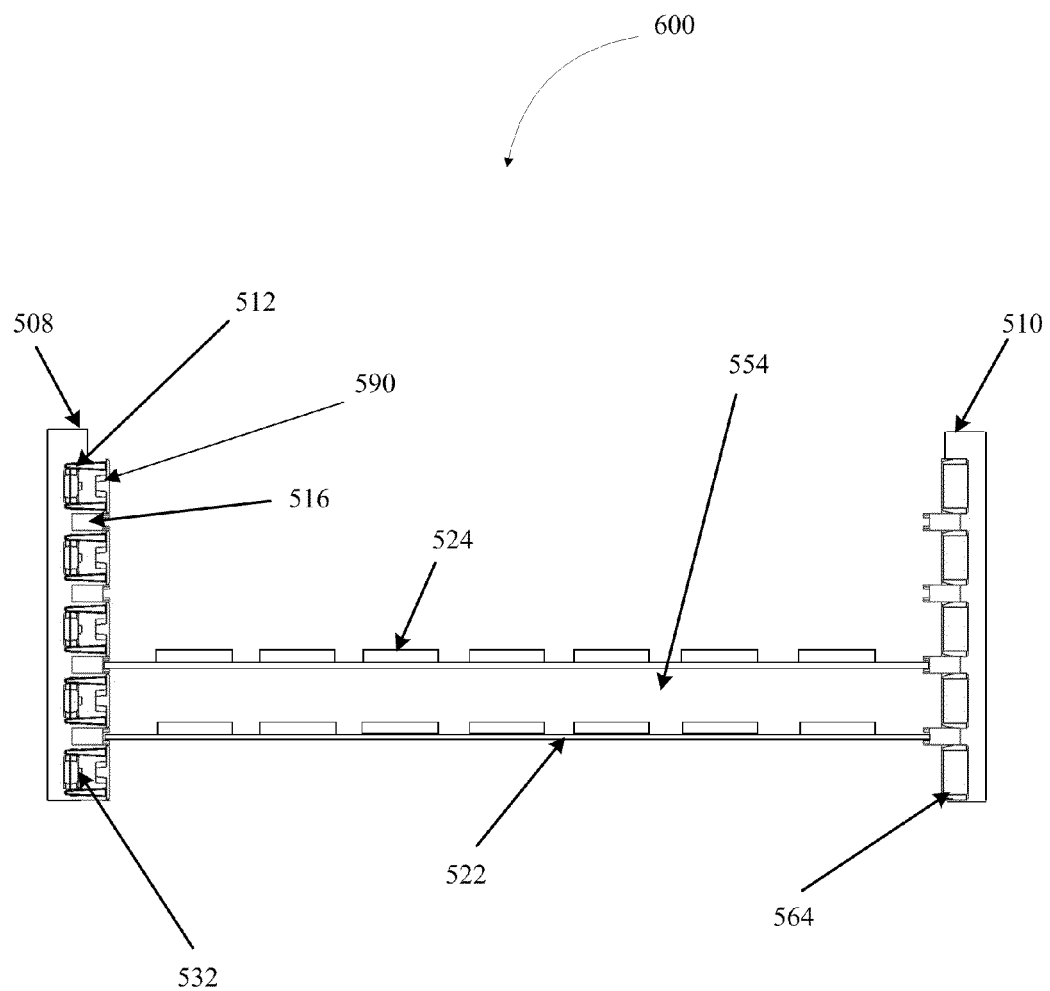
FIG. 6C is a plan view of the card cage of FIG. 6B.

FIG. 6C depicts a plan view of the card cage 504. In the plan view, one of the back rails 508 and one of the front rails 510 are shown. The back rail 508 contains the spray manifold assemblies 512. The spray manifold assembly 512 forms the nozzles 532 and may be connected to the spray collectors 590 that will be described in more detail in subsequent figures. The card guides 516 enable insertion of multiple ECBs 522 each containing multiple electronic components 524. In this system, a coolant is introduced into the spray manifold assembly 512 and the coolant flows through the nozzles in the spray manifold assembly 512. To introduce the coolant, the coolant may be sprayed into the narrow gap 554 to cool the electronic components 524. In some instances, the coolant flows toward a capillary structure 564, which may be made from a polymer material such as the capillary material produced by Porex® Corporation. The capillary structure 564 traps oil, water and other foreign particles and substances in the coolant and may also perform vapor/liquid separation as discussed later with respect to the FIG. 7 embodiment. The CRS 568 would be configured to receive the liquid coolant resulting from the vapor/liquid separation. In addition, the polymer material of the capillary 564 allows for pore sizes in the capillary structure 564 to be adjusted to the necessary size for a particular application. A wide range of pore sizes can be manufactured by Porex to tight tolerances.

Figure 6D:
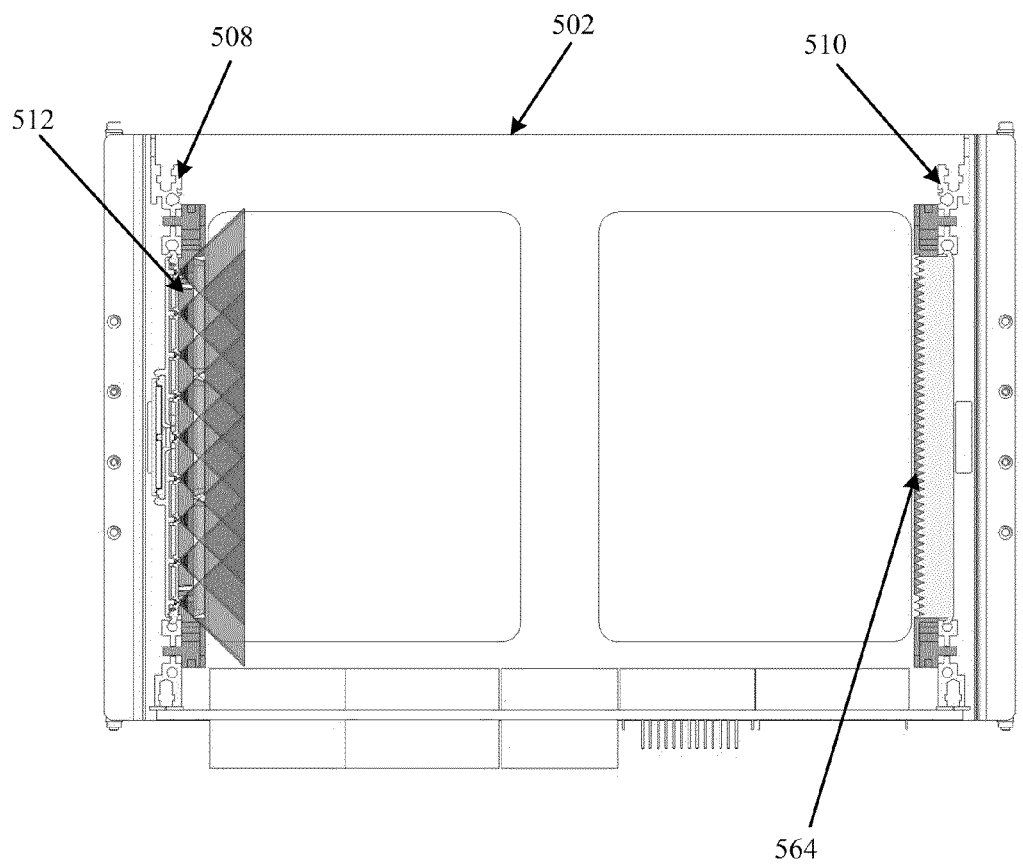
FIG. 6D is a side view of a housing and the card cage showing the cooling components.

FIG. 6D depicts a side view of the card cage 504. The housing 502 encloses card cage 504. As illustrated, the back rails 508 and the front rails 510 are located on opposite sides of the card cage 504. The spray manifold assembly 512 is inserted into a slot 542 formed by the pair of back rails 508. In a similar manner, the capillary structure 564 is inserted into a slot 544 formed by the pair of front rails 510 on the opposite side of the card cage 502. Further details illustrating how the spray manifold assembly 512 is secured in the slot are described in FIG. 6E below.

Figure 6E:
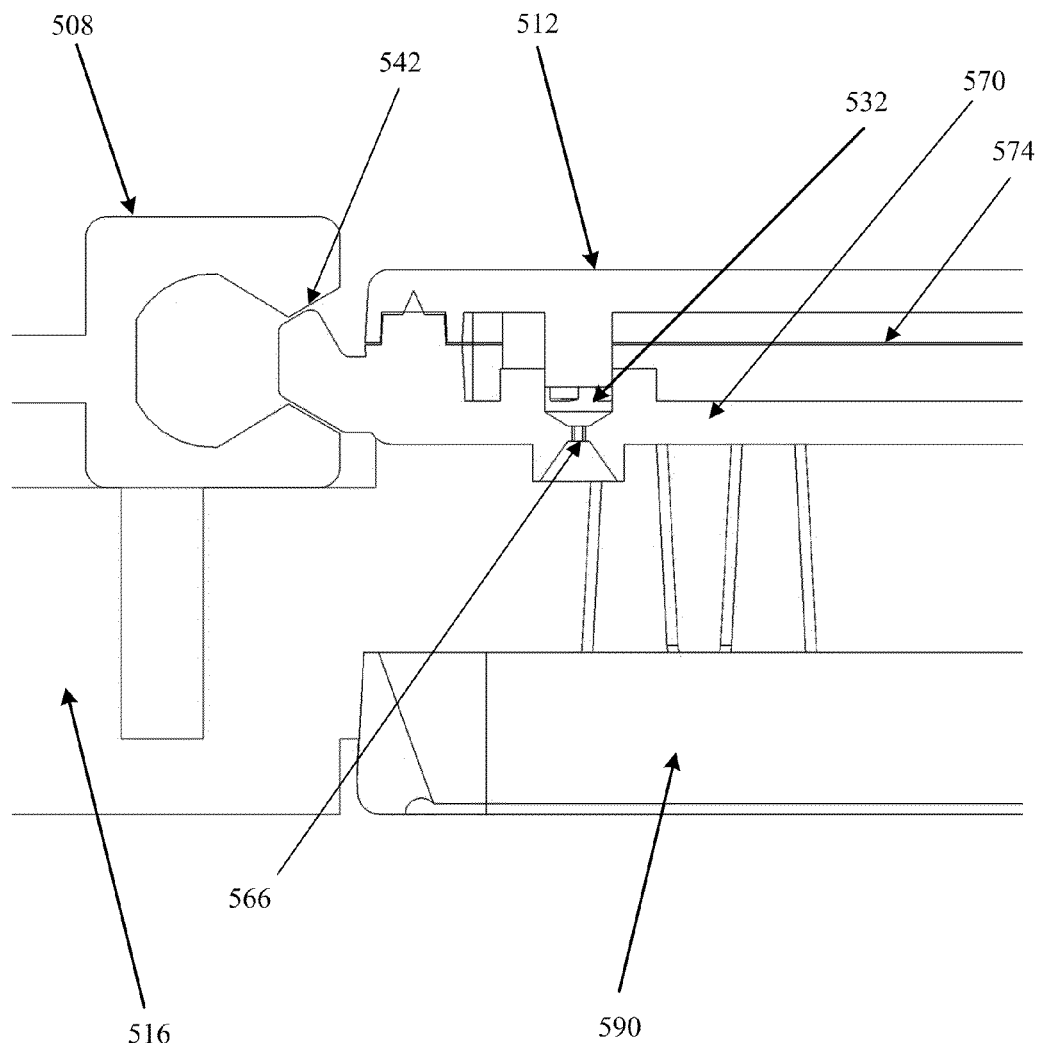
FIG. 6E is a close up view of one portion of the cutaway side view of the card cage in FIG. 6D showing the internal details of the spray manifold.

FIG. 6E illustrates the details of the spray manifold assembly 512. The spray manifold assembly 512 consists of a fluid outlet portion and a fluid inlet portion, which together form the nozzles 532. The fluid outlet portion and the fluid inlet portion are not fully shown in FIG. 6E and are discussed in more detail in FIGS. 6F and 6G, respectively. FIG. 6E shows the back rail 508 and the card guide 516 from the inside of the card cage 504 to provide perspective on the manner in which the spray manifold assembly 512 is inserted into the slot 542 in the card cage 504. The slot 542 extends along the length of the pair of back rails 508. The spray manifold assembly 512 slides into slot 542 in the card cage 502 as discussed in FIG. 6A above. The shape of the end of the spray manifold assembly 512 is designed to slide into the slot 542 in the top of the card cage 502 and snap in place with the edge of the back rail 508. A similar arrangement that is not shown may be used for the capillary structure 564 to slide into slot 544. In this embodiment, the slot 544 extends along the length of the pair of front rails 510. A spray collector 590 is connected to the spray manifold assembly 512 by snapping over interface lugs on the fluid outlet portion of the spray manifold assembly 512. FIG. 6E shows a discharge orifice 566 drilled or otherwise formed into a nozzle 532 in fluid outlet portion 570. A laser or other drilling techniques may be used to size the discharge orifice 566 by drilling through the center of the nozzle features 532 to form the discharge orifice 566. It is desirable to drill different sizes of discharge orifice 566 for different cooling applications, which requires adjustment of the inlet flow area (swirl ports) of nozzle features 578 if the required spray characteristics are to be maintained. This inlet area adjustment is achieved by closely controlling how much joint 574 collapses during the ultrasonic weld process. In this way an extensive set of spray manifold assemblies 512 with different flow rates and cooling capacities can be produced from only one tool set. Further details are discussed below with respect to FIGS. 6F through 6H.

Figure 6F:
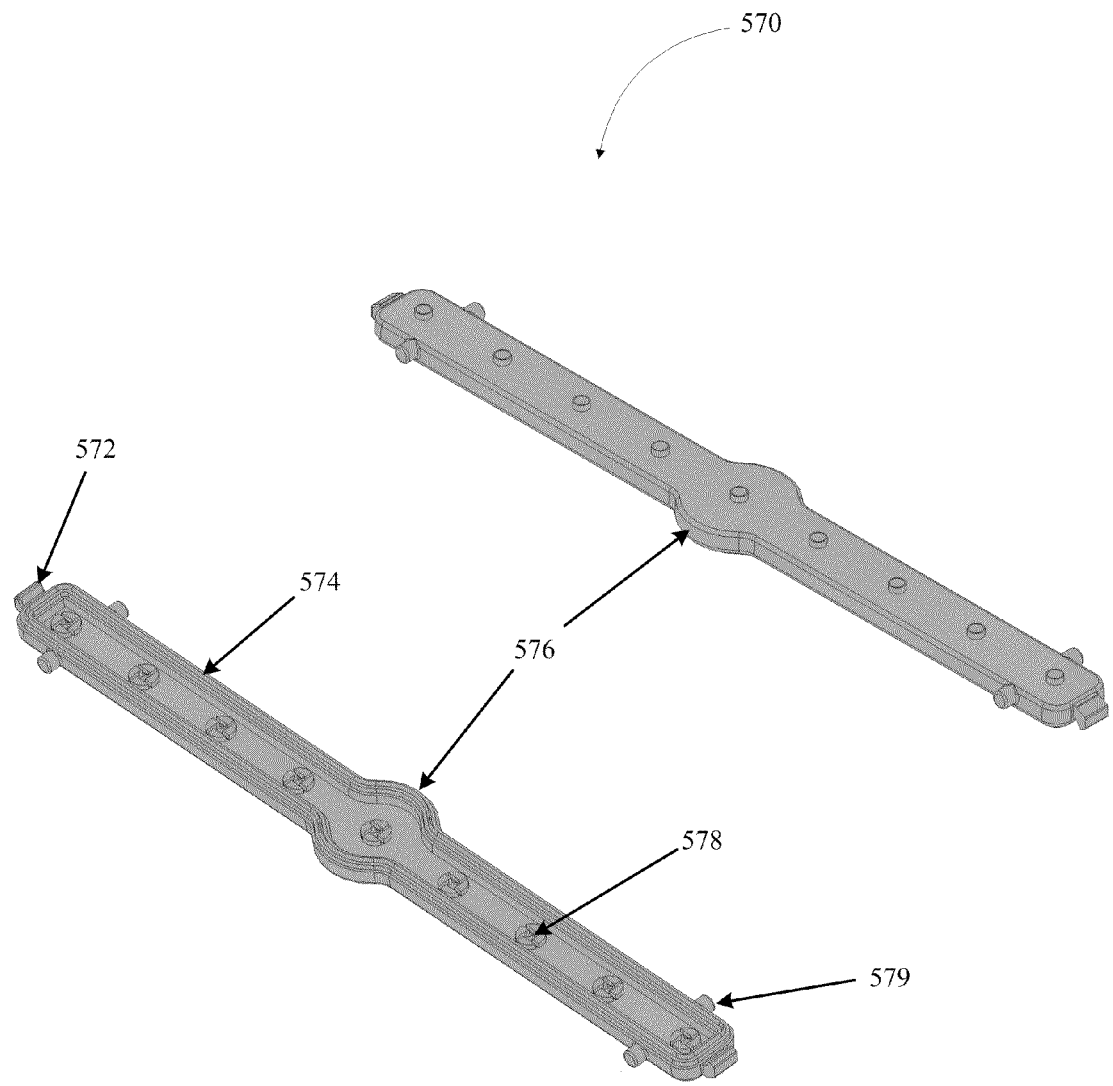
FIG. 6F is an isometric view of each side of the fluid outlet half of the spray manifold.
Figure 6G:
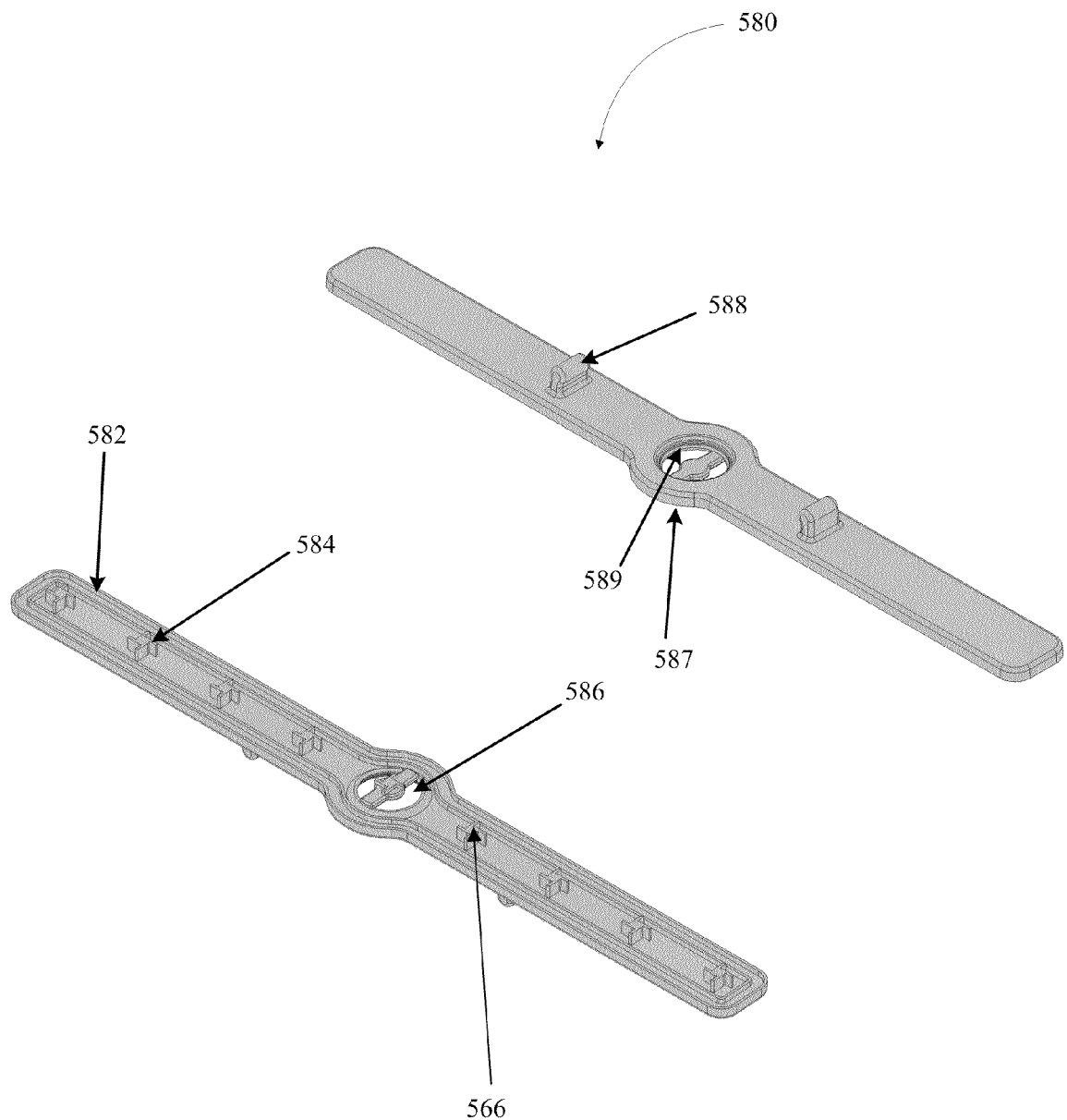
FIG. 6G is an isometric view of each side of the fluid inlet half of the spray manifold.
Figure 6H:
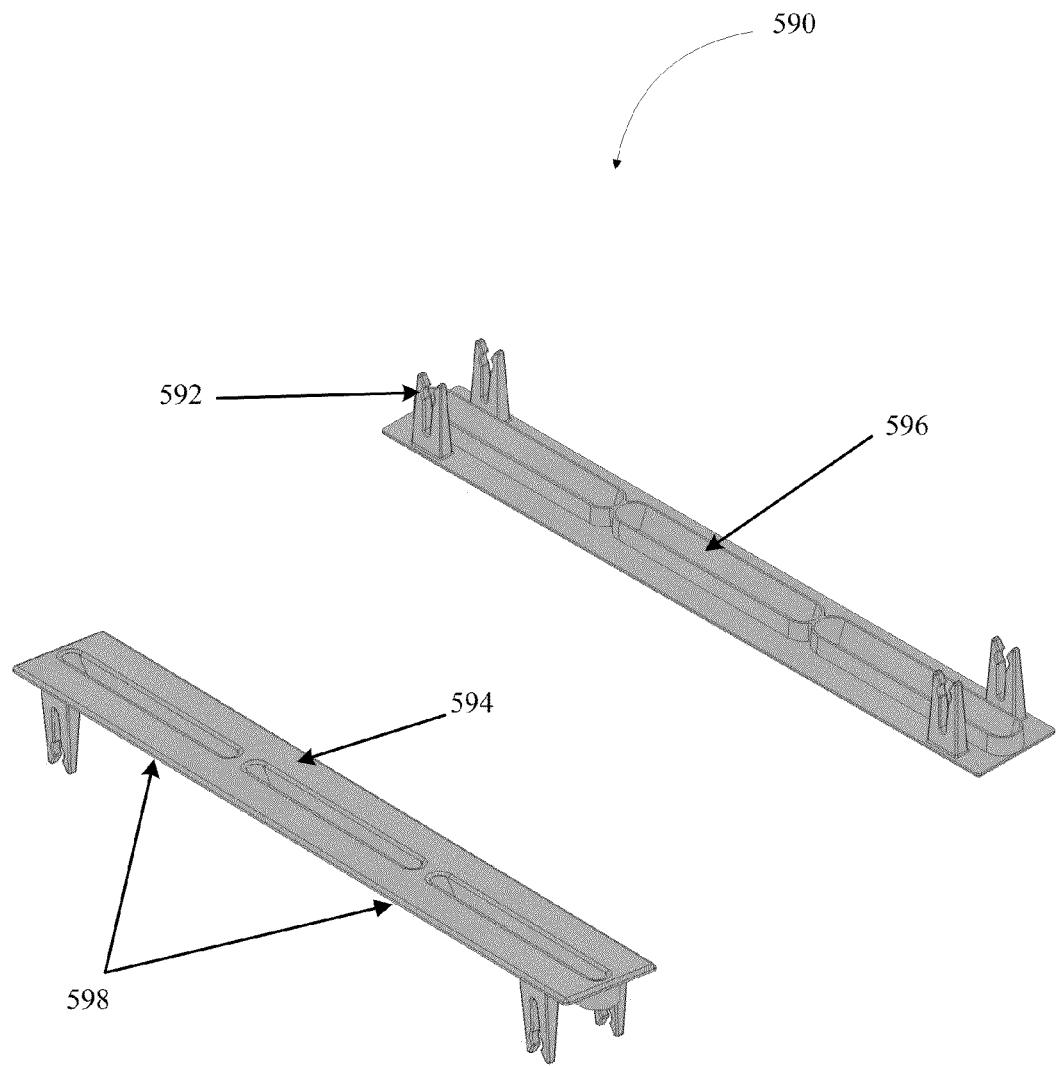
FIG. 6H is a plan view of a spray collector connected to the spray manifold assembly.

FIGS. 6F through 6H depict details of the spray manifold assembly 512. Both the fluid outlet portion 570 in FIG. 6F and a fluid inlet portion 580 in FIG. 6G are part of the spray manifold assembly 512. FIG. 6H depicts the spray collector 590 that connects to the spray manifold assembly 512. Discussion of the figures follows with some overlap due to the interconnectivity of the various portions.

FIG. 6F depicts the fluid outlet portion 570 of the spray manifold assembly 512. The fluid outlet portion 570 includes a rail interface feature 572 for securing the spray manifold assembly 512 into the slot in the card cage 504. The fluid outlet portion 570 may be made from any suitable material. One embodiment, for instance, uses a plastic material. As illustrated, an ultrasonic weld joint 574 extends around the periphery of the fluid outlet portion 570 for securing the fluid outlet portion 570 to the fluid inlet portion 580, as discussed in more detail in FIG. 6G. A center feature 576 positions the spray manifold assembly 512 between the card guides 516 to provide adequate space for interfacing with the LSH 533, shown in FIG. 6A. In an embodiment, the spray manifold assembly 512 is held in place between two card guides 516. One or more nozzle features 578 provide the nozzle or atomizer geometry that, when joined with the fluid inlet portion 580 in FIG. 6G, completes the nozzle 532. In addition, one or more interface lugs 579 allow the spray manifold assembly 512 to be attached to the spray collector 590 shown in FIG. 6H. One or more attachment prongs 592, shown in FIG. 6H, are configured to provide an opening into which the interface lugs 579 snap into place to secure the spray collector 590 to the spray manifold assembly 512.

FIG. 6G depicts the fluid inlet portion 580 of the spray manifold assembly 512. The fluid inlet portion 580 contains an ultrasonic weld joint 582 that is ultrasonically welded to the ultrasonic weld joint 574 on the fluid outlet portion 570. While other types of connection such as bonding may be used, ultrasonic welding provides a clean, secure bond between the fluid outlet portion 570 and the fluid inlet portion 580.

FIG. 6G also illustrates one or more nozzle cap features 584, which are designed to mate with the nozzle features 578 to form a complete nozzle 532. Nozzle 532 is of the type known in the art as a simplex pressure swirl atomizer. An aperture 586 provides an interface with the LSH 533. A center feature 587 is similar to the center feature 576 in the fluid outlet portion 570. Just as in the fluid outlet portion 570, the center feature 587 is used to center the spray manifold assembly 512 between the card guides 516. One or more snap features 588, meanwhile, provide an interface with the LSH 533. Finally, a peripheral nub 589 around aperture 586 forms an interface seal with the LSH 533 without having to use an o-ring or other type of fluid seal.

FIG. 6H depicts the spray collector 590 in more detail. The spray collector 590 connects to the spray manifold assembly 512 through the use of the attachment prongs 592 that snap over the interface lugs 579 on fluid outlet portion 570. The spray collector 590 has an exterior surface 594 and an interior surface 596. The preferred material of construction for the spray collector 590 is one of the known injection moldable polymers with some electrical current conductivity (for example, CoolPoly® E2 Thermally Conductive Liquid Crystalline Polymer (LCP) from Cool Polymers), thereby enabling it to act as a resistor in an electrical circuit. Plus and minus electrical bus bars 598 fit onto and across the spray collectors 590 to provide power to the spray collectors 590. Exterior surface 594 and interior surface 596 are typically metalized to act as electrodes for the spray collectors 590. When system 500 is started up in certain conditions, the bus bars 598 may be energized to cause electrical current to flow through the spray collectors 590, some of the electrical energy is dissipated as heat because of the low electrical conductivity chosen for the polymer material. The dissipated heat is transferred to the coolant flow as the sprays impinge upon the surfaces of spray collectors 590.

Figure 7:
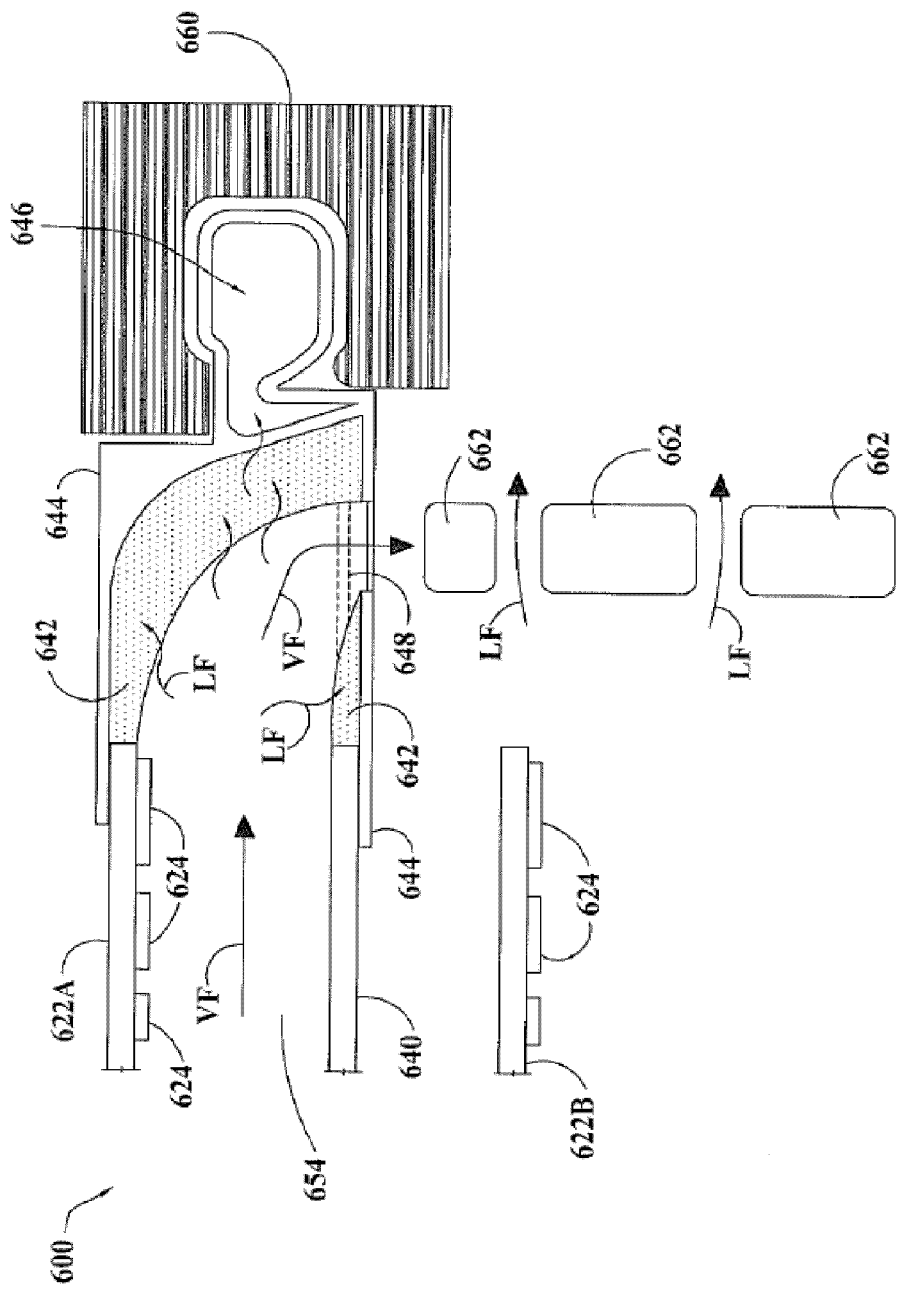
FIG. 7 is a plan view depicting details of a system in accordance with yet another embodiment.

FIG. 7 is a plan view depicting details of a system 600 in accordance with another embodiment of the present teachings. The system 600 includes a plurality of electronic circuit boards 622A and 622B, each bearing electronic components 624. The ECBs 622 of FIG. 7 are substantially analogous to electronic circuit boards (122A and 122B, 222A and 222B, etc.) described above and further detail is not required for an understanding of the system 600. The system 600 also includes a platen 640 disposed in spaced adjacency with the ECB 622A such that a narrow gap 654 is defined there between. The platen 640 (i.e., a plate, or wall-like partition) can be formed from any suitable, generally rigid material such as, for example, metal, plastic, fiberglass, etc. It is further assumed that an atomized spray (source not shown in FIG. 7) of coolant (droplets and circulating vapor) is provided into the narrow gap 654, substantially as described above in regard to the systems 100, 200, etc. It is to be understood that another electronic circuit board could be substituted in place of the platen 640 in order to cooperatively define the narrow gap 654 between itself and the ECB 622A. Other suitable configurations can also be used.

The system 600 of FIG. 7 also includes a vapor/liquid separation area (VLSA) 642. In one embodiment, the VLSA 642 is defined by a sloped surface the proceeds downward, with respect to gravity, away from ECB 622A. As depicted in FIG. 7, gravity is assumed to be a downward force directly away from the viewer (normal to the plane of the drawing sheet). In such an embodiment, the VLSA 642 can be formed from any suitable liquid impermeable material such as, for example, plastic, nylon, stainless steel, etc. In another embodiment, the VLSA 642 is formed from a material defining a multi-capillary or wick-like entity, such that the VLSA 642 is also referred to as a capillary device. Other suitable embodiments of the VLSA 642 can also be used. In any case, the VLSA 642 is configured to separate liquid droplets from vapors that impinge on the vapor/liquid separation area 642 as they respectively exit the narrow gap 654. In this way, liquids are drawn away from the narrow gap 654 in the direction designated "IF" in FIG. 7, while vapors generally continue out of the narrow gap 654 in the direction designated "VF".

The system 600 of FIG. 7 also includes a guide 644. The guide 644 can be formed from any suitable material such as, for example, nylon, plastic, metal, etc. Other materials can also be used. The guide 644 defines a liquid conduit or channel 646, which extends in the direction of gravity. The channel 646 is configured to receive liquids (i.e., condensed coolant) from the VLSA 642 and route them away toward a liquid coolant recirculation system (not shown) cooperative with the balance of the system 600. As further depicted in FIG. 7, the guide 644 is at least partially supportive of the ECB 622A and the platen 640. In turn, the guide 644 is slidably engaged with, and supported by, a support member 660. The support member 660 can be defined by any suitable material such as, for example, nylon, plastic, metal, etc. Other suitable materials can also be used to form the support member 660, as might be found in the Spray Cool card cage of U.S. Pat. No. 5,880,931. The system 600 further includes a liquid bridge 648 configured to route liquids generally away from the platen 640 (or proximate thereto) toward the channel 646. The liquid bridge 648 is typically defined by a short section of enclosed liquid conduit. Other embodiments of liquid bridge 648 can also be used. The system 662 further defines a plurality of vapor exit ports 662. Each vapor exit port 662 fluidly couples vapor flow (i.e., "VF") to other portions (not shown) of the system 600 such as, for example, a vapor condenser or a fluid pathway back into the narrow gap 654, etc.

The system 600 of FIG. 7 depicts at least one variation of liquid (condensed coolant, or condensate) and vapor separation that can be used in accordance with the present teachings, wherein dependence upon a heat exchanger, in the general sense established above, is not required. It is to be understood that other salient aspects of the system 600, not shown in FIG. 7, are (or can be) substantially analogous to those described above in regard to the system 100 of FIGS. 2A and 2B, etc. In one embodiment, the balance of the system 600 not shown in FIG. 7 can be assumed to be substantially equivalent to that of system 500 of FIGS. 6A-6H. Other suitable variations of the system 600 can also be defined and used.

Figure 8:
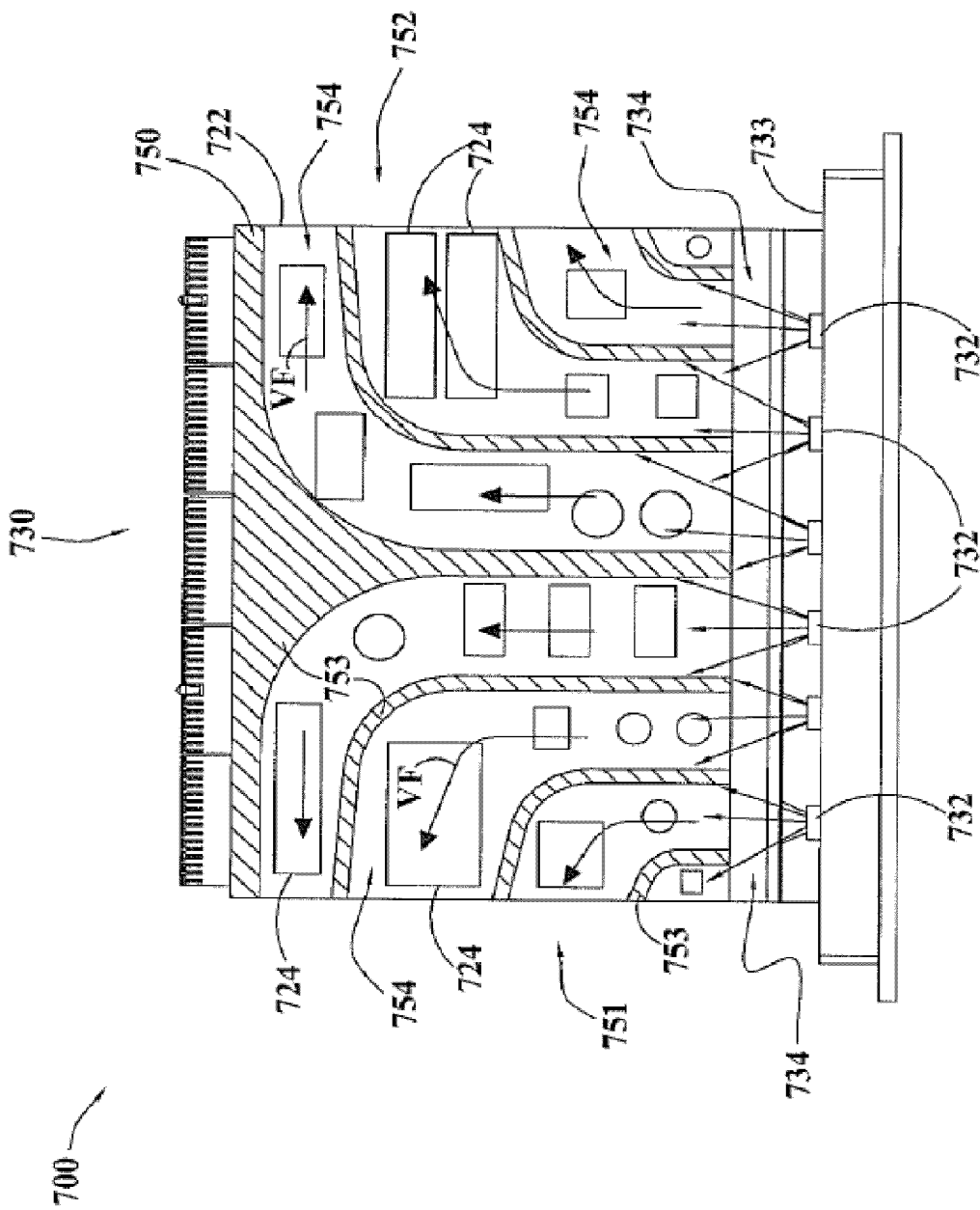
FIG. 8 is a plan view depicting a system in accordance with another embodiment.

FIG. 8 is a plan view depicting a system 700 in accordance with another embodiment of the present teachings. The system 700 includes an electronic circuit board 722, defined by a back edge 730 and supporting a plurality of electronic components 724. The system also includes a plurality of nozzles 732 coupled in fluid communication with a liquid supply header 733. Each of the nozzles 732 is configured to provide a spray 734 of atomized liquid (e.g., electrically non-conductive coolant) toward the electronic components 724 of the ECB 722. As depicted in FIG. 8, the spray 734 from at least one of the nozzles 732 at least partially overlaps the spray 734 of at least one other nozzle 732, though this is not necessary for effective cooling. In this way, the electronic components 724 are cooled by direct contacting exposure to droplets of the spray 734 of atomized liquid, resulting in a flow of vapors "VF" over the ECB 722. Thus, cooling operation of the system 700 of FIG. 8 is generally the same as described above in regard to the system 100 of FIGS. 2A and 2B, the system 500 of FIG. 6A-6H, etc., with notable differences described below.

The system 700 of FIG. 8 also includes a vapor guide 750. The vapor guide 750 can be formed from any suitable material. Non-limiting examples of materials usable in forming the vapor guide 750 include nylon, plastic, etc. The vapor guide 750 is positioned in very close, or contacting, overlying adjacency with the ECB 722. The vapor guide 750 includes (or defines) a plurality of guide vanes 753, in turn defining a plurality of curvilinear channels 754. Each channel 754 is configured to guide or direct a flow of vapors "VF" over the electronic components 724 located generally therein, while also directing the flow of vapors "VF" to exit at proximate one of a first side 751 or second side 752 of the electronic circuit board 722. Thus, as depicted in FIG. 8, at least some of the vapors "VF" transition from a first direction to a second direction of travel while traversing over the ECB 722. The system 700 also includes an overlying platen (not shown) that cooperates with the vapor guide 750 such that each channel 754 is defined as a generally enclosed fluid conduit, and further defining a narrow gap. In one embodiment, the overlying platen (not shown) is made integral with the vapor guide 750 such that a single, one-piece entity is defined.

Typical operation of the system 700 of FIG. 8 is as follows: Each nozzle 732 emits a respective spray 734 of coolant toward the ECB 722. The vapor guide 750, in conjunction with the overlying platen (not shown), function to guide the atomized liquid coolant and resulting vapor (i.e., flow "VF") over and into contacting adjacency with the various electronic components 724 of the electronic circuit board 722. In turn, the vapors derived from cooling the electronic components 724 are guided toward the respective first and second sides 751 and 752 of the ECB 722, in accordance with each particular channel 754, and further directed toward a system such as is shown by System 600 of FIG. 7. Thus, vapors and any remaining liquid droplets exiting each channel 754 can be readily cooled and/or separated for respective recirculation.

It is to be understood that the elements of the system 700 are typically incorporated into a larger (i.e., more complex) overall system including a plurality of such ECBs 722, etc., which are suitably protected and supported within an openable and closeable housing, provided with heat transfer and liquid recirculation systems, etc. Reference is made to the system 500 of FIGS. 6A-6H, as one exemplary configuration that can be suitably modified to incorporate one or more particular characteristics of the system 700 of FIG. 8. Thus, the system 700 is intended to represent one embodiment of sub-elements that can be incorporated and used in cooperation with other aspects of the present teachings.

Figure 9:
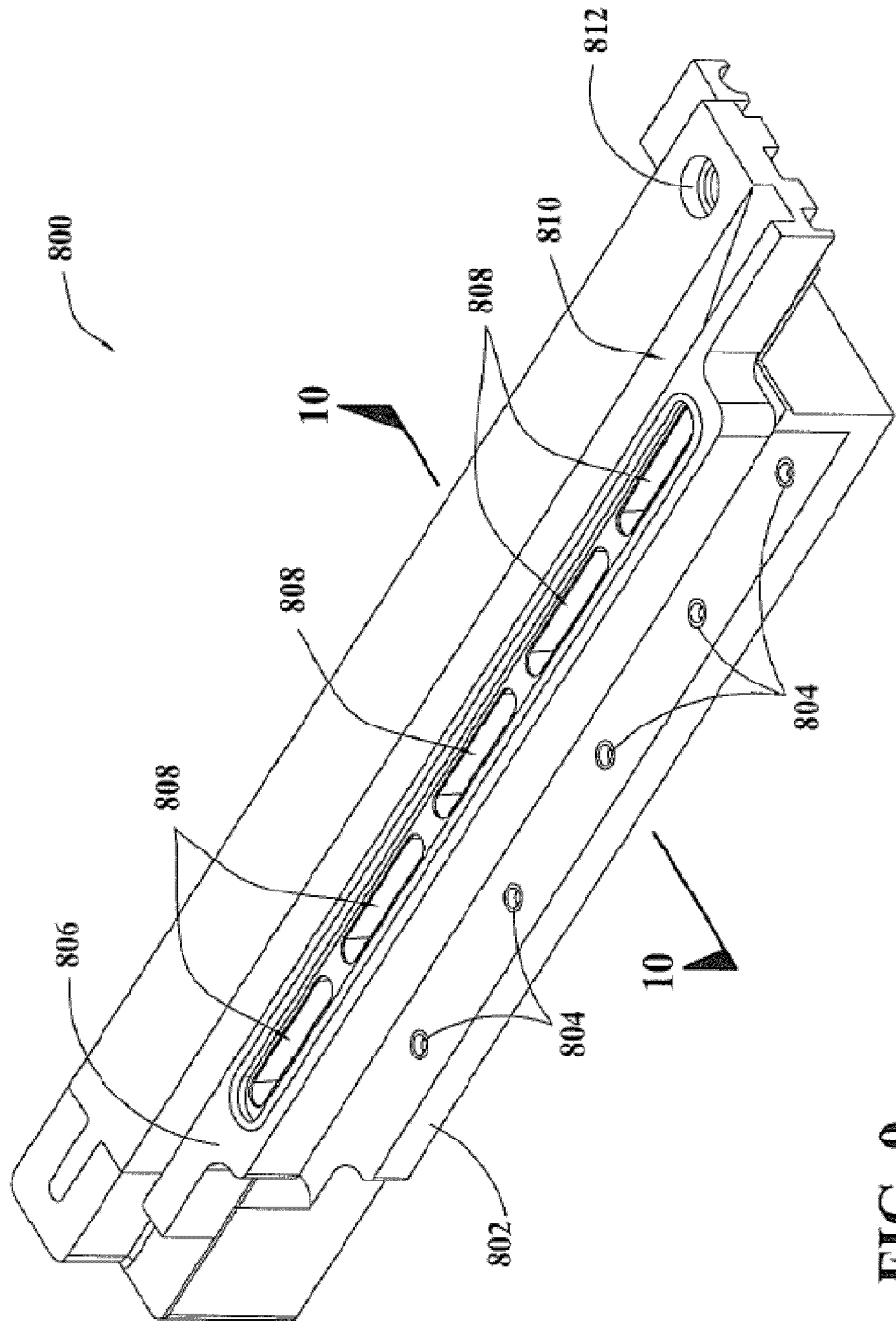
FIG. 9 is an isometric view depicting an apparatus in accordance with still another embodiment.

FIG. 9 is an isometric view depicting an apparatus 800 in accordance with another embodiment of the present teachings. The apparatus 800 includes a liquid supply header 802. The liquid supply header 802 can be formed from any suitable rigid material such as, for example, plastic, nylon, metal, etc. The liquid supply header (LSH) 802 defines a plurality of nozzles 804. Each of the nozzles 804 is coupled in fluid communication with the LSH 802 and is configured to emit a spray of atomized liquid droplets (not shown in FIG. 9; see FIG. 10). Each nozzle 804 is further configured such that the spray of atomized liquid is substantially conical in overall distribution pattern. Further elaboration on the performance aspects of the nozzles 804 is provided hereinafter in regard to FIG. 10.

The apparatus 800 of FIG. 9 also includes a re-shaper 806. The re-shaper 806 can be formed from any suitable rigid material such as, for example, plastic, nylon, metal, etc. In one embodiment, the re-shaper 806 and liquid supply header 802 are formed from the same material and are joined or bonded so as to define a singular entity. In another embodiment, the LSH 802 and re-shaper 806 are formed as respective portions of a singular entity. Other materials and/or configurations can be used with respect to the LSH 802 and/or re-shaper 806. The re-shaper defines a plurality of spray apertures 808 in one-to-one correspondence with the plurality of nozzles 804. As depicted in FIG. 9, the apparatus 800 includes (defines) a total of five nozzles 804 and five spray apertures 808. Other embodiments including other respective counts, and correspondences can also be used. Each spray aperture 808 is defined by a through aperture in the re-shaper 806 that smoothly transitions in geometry from a substantially circular entrance (which faces toward the LSH 802) to an elongated or oval exit (which faces away from the LSH 802). Furthermore, each spray aperture 808 is disposed in spaced, aligned adjacency with a corresponding nozzle 804. In this way, each spray aperture 808 is configured to receive substantially all of the conical spray of atomized liquid emitted by the associated nozzle 804, and to reshape that spray into a substantially flattened (i.e., planar), "fan-like" distribution pattern. While FIG. 9 depicts five nozzles 804 in one-to-one correspondence with five spray apertures 808, it is to be understood that other embodiments (not shown) can also be defined and used wherein a single spray aperture (e.g., 808, etc.) is cooperative with (in receptive alignment with) two or more nozzles (e.g., 804, etc.). Further elaboration on the performance aspects of the spray apertures 808 is provided hereinafter in regard to FIG. 10.

The apparatus 800 also defines a card guide (or slot) 810. The card guide 810 is configured to slidingly receive an edge of a compatible electronic circuit board (not shown in FIG. 9; see FIG. 10). The card guide 810 is further configured to ensure proper alignment and relative spacing between the LHS 802 and the re-shaper 806 relative to a corresponding electronic circuit board during normal operation. The apparatus 800 also include a through aperture 812. The through aperture 812 is generally provided to receive a threaded fastener or other known means used in mounting the apparatus 800 to a support frame (not shown), and/or to provide additional means of attachment to an electronic circuit board (not shown; see FIG. 10) received in the card guide 810.

Figure 10:
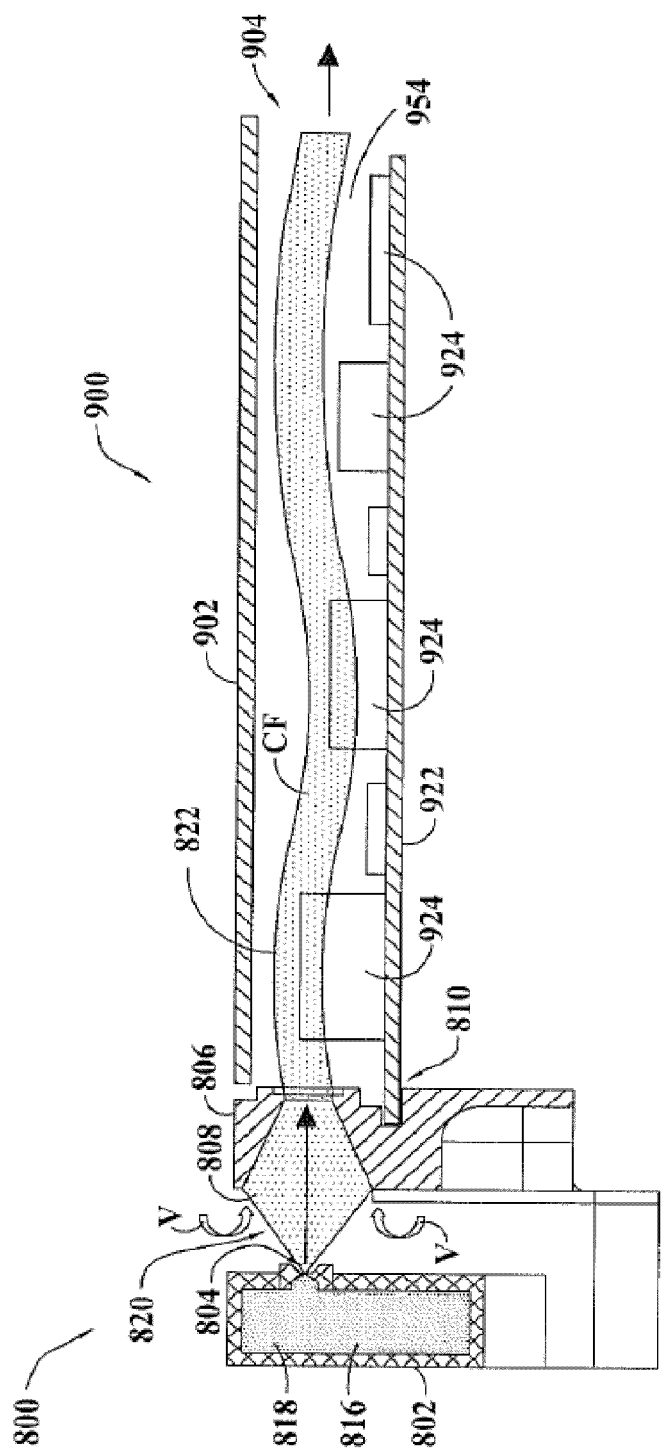
FIG. 10 is side elevation sectional view depicting operation of the apparatus of FIG. 9.

FIG. 10 is side elevation sectional view depicting typical operation of the apparatus 800 of FIG. 9. As depicted in FIG. 10, exemplary elements 900 are further depicted in the interest of understanding typical operation. Such exemplary elements include an electronic circuit board 922 and an overlying platen 902. The ECB 922 includes a plurality of electronic components 924. The overlying platen (or cover) 902 is disposed with respect to the ECB 922 such that a narrow gap 954 is defined there between. As depicted in FIG. 10, the liquid supply header 802 defines an internal fluid cavity 816, which is filled with a pressurized, electrically non-conductive liquid coolant 818.

Typical operation of the apparatus 800 is a follows: The liquid coolant 818 is expelled from the (i.e., each) nozzle 804 as a spray 820 of atomized droplets. The atomized drops of the spray 820 expand outward in a conical distribution pattern that is received by the (corresponding) spray aperture 808 of the re-shaper 806. Simultaneously, ambient vapor proximate to the nozzle 804 is drawn into the spray 820 and flows along with the atomized liquid droplets into the spray aperture 808. The spray aperture 808 reforms the atomized liquid (and vapor) into a substantially flattened, fanlike pattern of spray 822. This flattened spray 822 is directed away from the re-shaper 806 into the narrow gap 954 as a flow of coolant "CF".

The electronic components 924 of the ECB 922 are contactingly exposed to, and cooled by, the flow of coolant "CF". In turn, at least some of the droplets of atomized liquid coolant are vaporized and continue to move along with the flow "CF". Eventually, the flow of vapors and non-vaporized liquid exits the narrow gap 954 at the exit end 904. It is to be understood that the apparatus 800 can be used in combination with other elements and/or operations such as, for example, recirculation of vapors with respect to the narrow gap 954, heat transfer to a heat exchanger, vapor/liquid separation (e.g., 642 of FIG. 7), etc. Thus, it is contemplated that suitable embodiments of the apparatus 800 of FIGS. 9 and 10 can be defined and used in combination with any other suitable aspects of the present teachings.

Figure 11:
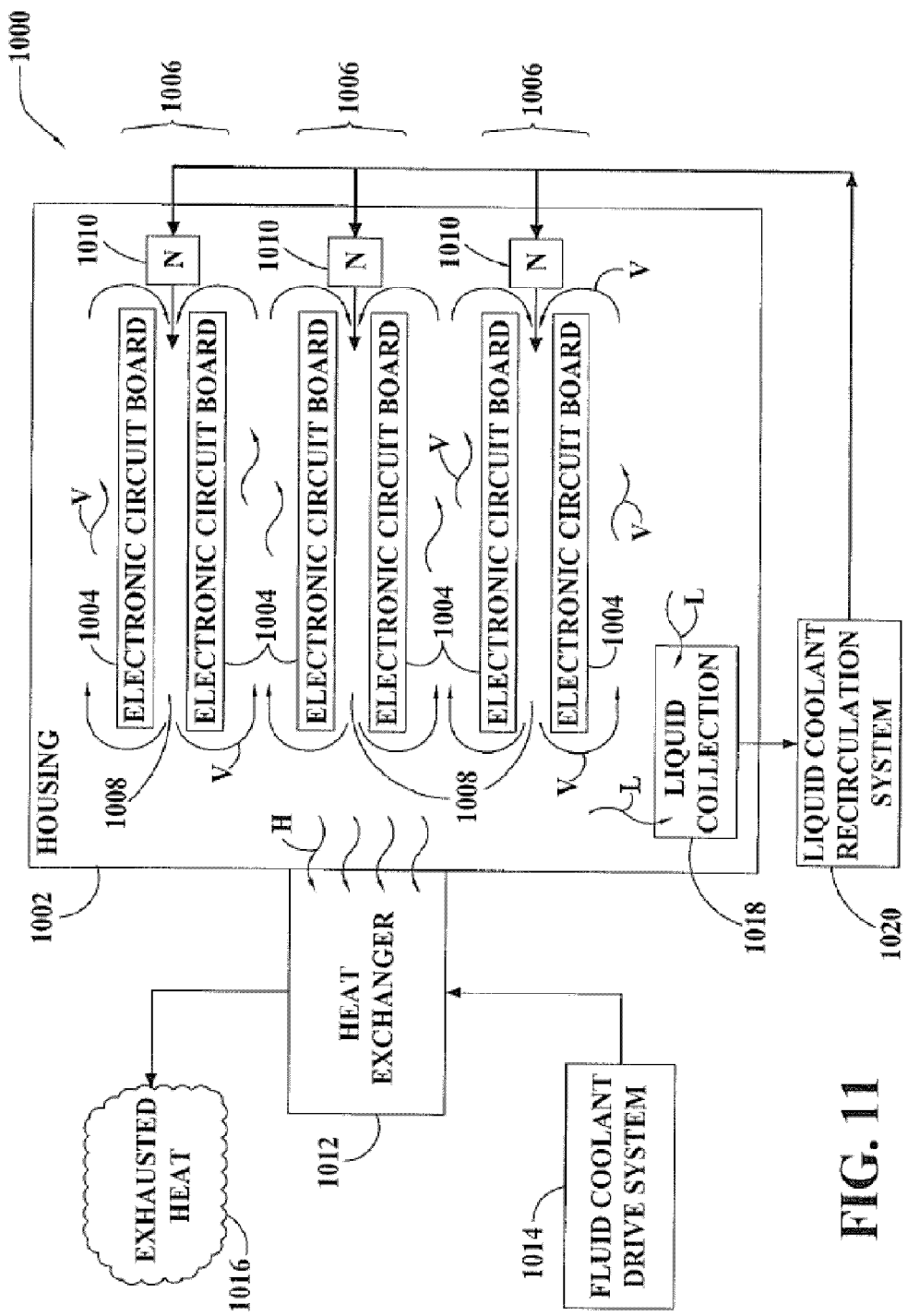
FIG. 11 is a block schematic depicting a system in accordance with another embodiment.

FIG. 11 is a block schematic diagram depicting a system 1000 in accordance with another embodiment of the present teachings. The system 1000 encompasses numerous of the widely applicable principles and methods of the present teachings, and is described in a broad and general manner in the interest of simplicity and clarity of understanding. The system 1000 includes a housing 1002. The housing 1002 is understood to provide an open-able and closeable, substantially hermetically sealed environment in which other system 1000 elements (described below) are supported and protected during normal operation. As such, the housing 1002 can be defined and configured as any number of particular embodiments consistent with the present teachings.

The system 1000 of FIG. 11 also includes a plurality of electronic circuit boards 1004 arranged as a respective plurality of pairs 1006 of such electronic circuit boards (ECBs) 1004. Each pair 1006 of ECBs 1004 is further configured to define a narrow gap 1008 there between. The system 1000 further includes a plurality of nozzles 1010, each plurality in one-to-one correspondence with the plurality of narrow gaps 1008. Each plurality of nozzles 1010 is configured to spray an atomized liquid of electrically nonconductive coolant into the narrow gap 1008 corresponding thereto. The spray and subsequent flow of atomized liquid coolant through each narrow gap 1008 results in the transference of heat from (i.e., cooling of) the electronic circuit boards 1004 of the associated pair 1006, and the generation of a corresponding quantity vapor "V". In turn, a circulation of the vapor "V" is driven by the imparted momentum of the spray (from the nozzles 1010) out of each narrow gap 1008, back toward each plurality of nozzles 1010, and then back into each of the narrow gaps 1008.

The system 1000 further includes a heat exchanger 1012. The heat exchanger 1012 is configured to transfer heat "H" from within the housing 1002 into a corresponding heat removal fluid (suitable gas or liquid). This fluid is provided to the heat exchanger 1012 by way of fluid coolant drive system (FCDS) 1014. The FCDS 1014 can be suitably defined by any system capable of delivering a coolant fluid such as air, oil, PAO, water, etc., to and through the heat exchanger 1012, resulting in exhausted heat 1016 that is removed from the system 1000. The heat exchanger 1012 further serves to condense any vapor "V" and/or non-vaporized droplets of the atomized liquid coolant that contact or impinge upon it, thus deriving a condensate (liquid} "L".

The condensate "L" that is, the vapors condensed back to liquid phase—are collected, typically under the influence of gravity, by a liquid collection apparatus (LCA) 1018. The LCA 1018 can include any suitable elements such as liquid receiving ports, attitude independent valves, a capillary device operating in cooperation with (or alternatively, standing alone from) the heat exchanger 1012, etc., and is configured to receive liquid (coolant) from one or more locations within the housing 1002. In turn, the LCA 1018 communicates the received liquid (coolant) to a liquid coolant recirculation system (LCRS) 1020. The LCRS 1020 can include any suitable elements such as a vapor-to-liquid condenser, a combiner, a pump, etc. In any case, the LCRS 1020 is configured to receive liquid coolant and to provide such coolant as a pressurized stream to the plural rows of plural nozzles 1010. Thus, a closed-loop liquid circulation system is defined by the rows of plural nozzles 1010, the housing 1002, the LCA 1018 and the LCRS 1020.

While the above methods and apparatus have been described in language more or less specific as to structural and methodical features, it is to be understood, however, that they are not limited to the specific features shown and described, since the means herein disclosed comprise preferred forms of putting the invention into effect. The methods and apparatus are, therefore, claimed in any of their forms or modifications within the proper scope of the appended claims appropriately interpreted in accordance with the doctrine of equivalents.

The inventon claimed is:

1. A system, comprising:
   an electronic circuit board (ECB);
   an overlying platen adjacent to the ECB to form a gap between the overlying platen and the ECB;
   a liquid supply header defining an internal fluid cavity filled with an electrically non-conductive liquid coolant;
   a plurality of nozzles; and
   a re-shaper comprising a plurality of spray apertures in communication with the liquid supply header;
   wherein the liquid coolant is expelled in the form of a spray of atomized droplets from the plurality of nozzles in a conical distribution pattern that is received by a corresponding spray aperture in the re-shaper,
   wherein ambient vapor proximate to each of the plurality of nozzles is simultaneously drawn into the spray of atomized droplets,
   wherein the plurality of spray apertures reform the spray and the ambient vapor into a substantially flattened, fan-like pattern that is directed away from the re-shaper and into the gap in the form of a flow of coolant, and
   wherein the flow of coolant is contactingly exposed to the ECB to provide cooling.

2. The system of claim 1, wherein the system further includes a card guide configured to slidingly receive an edge of the ECB to provide alignment and spacing between the liquid supply header and the re-shaper relative to the ECB.

3. The system of claim 1, wherein the ECB comprises a plurality of electronic components.

4. The system of claim 1, wherein each of the plurality of nozzles is coupled in fluid communication with the liquid supply header.

5. The system of claim 1, wherein the re-shaper and the liquid supply header are joined and bonded to form a singular entity.

6. The system of claim 1, wherein the re-shaper defines the plurality of spray apertures in one-to-one correspondence with the plurality of nozzles.

7. The system of claim 1, wherein each of the plurality of spray apertures is defined by a through aperture in the re-shaper that transitions in geometry from a substantially circular entrance facing the liquid supply header to an elongated exit facing away from the liquid supply header.

8. The system of claim 1, wherein the system is used in combination with respect to at least one of the following:
   recirculation of vapors to the gap;
   heat transfer to a heat exchanger; and
   vapor/liquid separation by capillary action.

9. A system, comprising:
   a housing configured to enclose a card cage;
   a plurality of card guides for inserting a plurality of electronic circuit boards (ECBs) into the card cage;
   a plurality of rails configured to provide a slot on a top surface of the card cage;
   at least one spray manifold comprising a fluid inlet portion and a fluid outlet portion that when connected together form a plurality of nozzles, wherein the at least one spray manifold is inserted into the slot on the top surface of the card cage; and
   a spray collector connected to each of the at least one spray manifolds;
   wherein each connected spray manifold and the spray collector are inserted into the slot on the top surface of the card cage for spraying a coolant in a gap formed between each of the plurality of ECBs.

10. The system of claim 9, wherein the fluid inlet portion and the fluid outlet portion are connected together using ultrasonic welding.

11. The system of claim 9, the system further comprising a capillary for filtering the coolant.

12. The system of claim 11, wherein the capillary is located on the opposite side of the card cage from the at least one spray manifold and the spray collector.

13. The system of claim 9, further comprising a liquid supply header to supply the at least one spray manifold with coolant.

14. A system, comprising:
- a housing configured to enclose a card cage;
- a plurality of electronic circuit boards (ECBs) disposed within the card cage, each of the plurality ECBs spaced apart using a plurality of card guides to form a gap between each of the ECBs;
- at least one spray manifold and a corresponding spray collector connected together to collect and disperse a coolant into the narrow gap, wherein the at least one spray manifold and the corresponding spray collector are connected together by snapping a plurality of interface lugs into a plurality of attachment prongs; and
- a capillary structure located on the opposite side of the at least one spray manifold,
- wherein the coolant flows from the at least one spray manifold, through the spray collector, through the narrow gap and impinges on the capillary structure before entering a coolant recirculation system.

15. The system of claim 14, wherein the spray manifold comprises a fluid outlet portion and a fluid inlet portion that are connected together to form a plurality of nozzles.

16. The system of claim 15, wherein the fluid outlet portion and the fluid inlet portion are connected together using ultrasonic welding.

17. The system of claim 14, wherein a fluid outlet portion of the spray manifold includes the plurality of interface lugs and the spray collector includes the plurality of attachment prongs.

18. The system of claim 15, wherein a joint collapse resulting from the connection of the fluid outlet portion and the fluid inlet portion is controlled in accordance with a size of a discharge orifice.

19. The system of claim 14, wherein the spray collector is configured to operate as a fluid heater.

* * * * *